US012145816B2

(12) United States Patent
Lee et al.

(10) Patent No.: US 12,145,816 B2
(45) Date of Patent: Nov. 19, 2024

(54) CONTINUOUS MANUFACTURING OF SURFACE WRINKLE FEATURES

(71) Applicant: THE TRUSTEES OF THE UNIVERSITY OF PENNSYLVANIA, Philadelphia, PA (US)

(72) Inventors: Daeyeon Lee, Wynnewood, PA (US); Kathleen Stebe, Penn Valley, PA (US); Shu Yang, Blue Bell, PA (US); Xu Zhang, Claymont, DE (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 809 days.

(21) Appl. No.: 17/053,909

(22) PCT Filed: May 24, 2019

(86) PCT No.: PCT/US2019/033926
§ 371 (c)(1),
(2) Date: Nov. 9, 2020

(87) PCT Pub. No.: WO2019/226995
PCT Pub. Date: Nov. 28, 2019

(65) Prior Publication Data
US 2021/0238001 A1 Aug. 5, 2021

Related U.S. Application Data

(60) Provisional application No. 62/770,610, filed on Nov. 21, 2018, provisional application No. 62/676,319, filed on May 25, 2018.

(51) Int. Cl.
*B65H 37/02* (2006.01)
*H01L 31/0216* (2014.01)
*H01L 31/0236* (2006.01)

(52) U.S. Cl.
CPC ....... *B65H 37/02* (2013.01); *H01L 31/02168* (2013.01); *H01L 31/0236* (2013.01); *B65H 2301/51145* (2013.01); *B65H 2701/124* (2013.01); *B65H 2701/172* (2013.01); *B65H 2801/87* (2013.01)

(58) Field of Classification Search
CPC ...................................................... B65H 37/00
See application file for complete search history.

(56) References Cited

FOREIGN PATENT DOCUMENTS

| CN | 103789741 A | 5/2014 |
|---|---|---|
| JP | 6295175 B2 | 3/2018 |
| KR | 10-1631968 B1 | 6/2016 |
| WO | 2016/115640 A1 | 7/2016 |

OTHER PUBLICATIONS

Bowden et al., "Spontaneous formation of ordered structures in thin films of metals supported on an elastomeric substrate," 1998, Nature 393, pp. 146-149. (Year: 1998).*

(Continued)

*Primary Examiner* — Robert A Vetere
(74) *Attorney, Agent, or Firm* — BakerHostetler

(57) ABSTRACT

Provided are systems and methods for inducing strain fields to give rise to controllable wrinkle patterns in a variety of substrates. Also provided are articles having persistent wrinkling patterns thereon.

8 Claims, 34 Drawing Sheets

(56) References Cited

OTHER PUBLICATIONS

Bowden et al., "Spontaneous formation of ordered structures in thin films of metals supported on an elastomeric polymer," 1998, Nature 393, pp. 146-149. (Year: 1998).*
Guo et al., "Three dimensional strain distribution of wrinkled silicon nanomembranes fabricated by rolling-transfer technique," Appl. Phys. Letters 103, p. 264102, 2013. (Year: 2013).*
Yang et al., "Harnessing Surface Wrinkle Patterns in Soft Matter," 2010, Adv. Funct. Mater. 20, pp. 2550-2564. (Year: 2010).*
Chung et al., Surface wrinkling: a versatile platform for measuring thin-film properties, Adv. Mater., 2011, 23(3):349-68.
Efimenko et al., Development and Testing of Hierarchically Wrinkled Coatings for Marine Antifouling, ACS Appl Mater Interfaces 2009, 1, 1031-1040.
Genzer et al., Soft matter with hard skin: From skin wrinkles to templating and material characterization, Soft Matter, 2006, 2, 310-323.
Guvendiren et al., Swelling-Induced Surface Patterns in Hydrogels with Gradient Crosslinking Density, Adv. Funct. Mater., 2009, 19, 3038-3045.
Jiang et al., Bifurcation-based embodied logic and autonomous actuation, Nat. Commun., 2019, 10, 128.
Khang et al., Mechanical Buckling: Mechanics, Metrology, and Stretchable Electronics, Adv. Funct. Mater., 2009, 19(10), 1526-1536.
Kim et al., Solvent-Responsive Surface via Wrinkling Instability, Adv. Mater., 2011, 23(36), 4188-4192.
Lamoureux et al., Dynamic kirigami structures for integrated solar tracking, Nat. Commun., 2015, 6, 8092.
Lin et al., Self-similar Hierarchical Wrinkles as a Potential Multifunctional Smart Window with Simultaneously Tunable Transparency, Structural Color, and Droplet Transport, ACS Appl. Mater. Interfaces, 2017, 9(31), 26510-26517.
Mayer et al., Template-assisted colloidal self-assembly of macroscopic magnetic metasurfaces, Faraday Discuss., 2016, 191, 159-176.
Minati et al., Gold nanoparticles 1D array as mechanochromic strain sensor, Mater. Chem. Phys., 2017, 192, 94-99.
Pazos-Perez et al., Highly uniform SERS substrates formed by wrinkle-confined drying of gold colloids, Chem. Sci., 2010, 1, 174-178.
Qi et al., Writing Wrinkles on Poly(dimethylsiloxane) (PDMS) by Surface Oxidation with a CO2 Laser Engraver, ACS Appl. Mater. Interfaces, 2018, 10, 4295-4304.
Rahmawan et al., Recent advances in wrinkle-based dry adhesion, Soft Matter, 2014, 10, 5028-5039.
Rhee et al., Crack-Free, Soft Wrinkles Enable Switchable Anisotropic Wetting, Angew. Chem. Int. Ed. 2017, 56, 6523-6527.
Rodriguez-Hemandez et al., Wrinkled interfaces: Taking advantage of surface instabilities to pattern polymer surfaces, Prog. Polym. Sci., 2015, 42, 1-41.
Song et al., An analytical study of two-dimensional buckling of thin films on compliant substrates, J. Appl. Phys., 2008, 103, 014303.
Stafford et al., A buckling-based metrology for measuring the elastic moduli of polymeric thin films, Nat. Mater., 2004, 3, 545-550.
Sun et al., Controlled buckling of semiconductor nanoribbons for stretchable electronics, Nat. Nanotechnol., 2006, 1, 201-207.
Wang et al., "Highly efficient and selective isolation of rare tumor cells using a microfluidic chip with wavy-herringbone micropatterned surfaces," Analyst, 2016, 141, pp. 2228-2237.
Wang et al., Wrinkled, wavelength-tunable graphene-based surface topographies for directing cell alignment and morphology, Carbon, 2016, 97, 14-24.
Wu et al., Topographic substrates as strain relief features in stretchable organic thin film transistors, Org. Electron., 2013, 14(6), 1636-1642.
Yu et al., Tackling the Scalability Challenge in Plasmonics by Wrinkle-Assisted Colloidal Self-Assembly, Langmuir 2019, 35, 26, 8629-8645.
Zhou et al., Mechanical Properties of Aligned Nanotopographies for Directing Cellular Behavior, Adv. Mater. Interfaces, 2016, 3, 1600275.
Chandra et a., "Self-Wrinkling of UV-Cured Polymer Films," Advanced Materials, 2011, 23(30), pp. 3441-3445.
Chen et al., "Wrinkling Instabilities in Polymer Films and Their Applications," Polymer International, 2012, 61(7), pp. 1041-1047.
Chung et al., "Diffusion-Controlled, Self-Organized Growth of Symmetric Wrinkling Patterns," Advanced Materials, 2009, 21(13), pp. 1358-1362.
Lin et a., "Spontaneous Formation of One-Dimensional Ripples in Transit to Highly Ordered Two-Dimensional Herringbone Structures through Sequential and Unequal Biaxial Mechanical Stretching," Applied Physics Letters, 2007, 90(24), 241903.
Bowden, et al. "Spontaneous formation of ordered structures in thin films of metals supported on an elastomeric polymer." Nature 393.6681 (May 14, 1998): 146. Abstract, p. 147 col 1 para 1-2; p. 147 col 2 para 1; p. 148 col 1 para 2-6; p. 148 col 2 para 1; Figure 1; and Figure 3.
Chen, et al. "Guided wrinkling in swollen, pre-patterned photoresist thin films with a crosslinking gradient." Soft Matter 9.46 (Oct. 16, 2013): 11007-11013.
Hidber, et al. "New strategy for controlling the size and shape of metallic features formed by electroless deposition of copper: Microcontact printing of catalysts on oriented polymers, followed by thermal shrinkage." Langmuir 12.21 (Oct. 16, 1996): 5209-5215. p. 5210 col 1.
Yang, et al. "Harnessing surface wrinkle patterns in soft matter." Advanced Functional Materials 20.16 (Aug. 23, 2010): 2550-2564.

* cited by examiner

US 12,145,816 B2

CONTINUOUS MANUFACTURING OF SURFACE WRINKLE FEATURES

CROSS-REFERENCE TO RELATED APPLICATIONS

This application is the National Stage Application of International Patent Application No. PCT/US2019/033926 (filed May 24, 2019), which claims priority to and the benefit of U.S. patent application No. 62/676,319 (filed May 25, 2018) and U.S. patent application No. 62/770,610 (filed Nov. 21, 2018), the entireties of which applications are incorporated herein by reference in their entireties for any and all purposes.

GOVERNMENT RIGHTS

This invention was made with government support under 1449337 and 1542153 awarded by the National Science Foundation. The government has certain rights in the invention.

TECHNICAL FIELD

The present disclosure relates to the field of nano- and microscale surface features and to the field of roll-to-roll manufacture of materials.

BACKGROUND

Wrinkling is a ubiquitous surface phenomenon that occurs at a wide range of length scales from kilometers to nanometers. Particularly, micro/nano-scale wrinkles have found applications in stretchable electronics, tunable optics and coatings with controlled wettability and adhesions. Although various techniques including thermal treatment, swelling, mechanical stretching, and UV curing, have been developed for wrinkle fabrication, most are not suitable for large scale, continuous manufacturing. Accordingly, there is a long-felt need for improved methods of manufacturing wrinkles in various substrates.

SUMMARY

Surface wrinkling is a spontaneous mechanical instability phenomenon which has been used in noncontact fabrication of micro/nanoscale surface patterns. The wide range of textures that can be generated via wrinkling imbues surfaces with useful functionality and applications, such as tunable optics, stretchable electronics, and coatings with controlled wettability and adhesion.

Conventional methods of wrinkle fabrication typically rely on batch processes in piece-by-piece fashion, not amenable for scale-up to enable commercialization of surface wrinkle-related technologies. In this work, a scalable manufacturing method for surface wrinkles is demonstrated on a cylindrical support using curvature-induced strains.

In one illustrative, non-limiting example, a bending strain was introduced to a thin layer of ultraviolet (UV)-curable polydimethylsiloxane (UV-PDMS) coated on top of a soft PDMS substrate by wrapping the bilayer around a cylindrical roller. After curing the UV-PDMS and subsequently releasing the bending strain, one-dimensional or checkerboard surface wrinkles were produced. Experimental and computational analyses show that these patterns form as a result of the interplay between swelling and bending strains. Continuous manufacturing of surface wrinkles is demonstrated by using a two-roller roll-to-roll (R2R) prototype. As one example of the utility of these textures, surface wrinkles produced in this manner are shown to enhance the light harvesting and thus efficiency of a solar cell at oblique angles of illumination due to the wrinkles light scattering properties.

In one example, large-area one-dimensional (1D) wrinkles with 3 μm wavelength are demonstrated on a 9 cm diameter substrate using manual sequential rolling, which shows that this approach can be used in continuous R2R manufacturing of wrinkling. 1D gratings, two-dimensional (2D) herringbone and labyrinth patterns are generated using this technique, with feature sizes in the tens and hundreds of nanometers (e.g., heights and or wavelengths of from about 10 to about 100, 200, 300, 400, 500, 600, 700, 800, 900, or even 1000 nm) up to, e.g., to tens of microns (e.g., about 10, 20, 30, 40, 50, 60, 70, 80, 90, or even about 100 microns), which are useful for a variety of potential applications.

In one aspect, the present disclosure provides methods, comprising: (a) with a working material that comprises an elastomeric material and a second material that defines the uppermost portion of the working material, effecting a stress within the working material, the effecting being accomplished by contacting the elastomeric material to a support substrate, optionally applying a stimulus so as to change a mechanical property of the uppermost portion of the working material, and at least partially releasing the stress within the working material so as to give rise to a plurality of persistent wrinkles in the uppermost portion of the working material: (b) applying a stimulus so as to change a mechanical property of an uppermost portion of a working material that comprises an elastomeric material, effecting a stress within the working material, the effecting being accomplished by contacting the elastomeric material to a support substrate, and at least partially releasing the stress within the intermediate material so as to give rise to a plurality of persistent wrinkles in the uppermost portion of the working material: or (c) any combination of (a) or (b).

Also provided are persistently wrinkled materials produced according to the present disclosure.

Further provided are systems, comprising: a (first) support substrate: the system being configured to contact a working material to the support substrate so as to give rise to a stress within the working material; and optionally, a stimulus source configured to apply a stimulus to an uppermost portion of the working material, and the system being configured to at least partially release the stress within the working material so as to give rise to a plurality of persistent wrinkles in the uppermost portion of the working material. As described and shown herein, such systems allow for roll-to-roll production of materials have persistent wrinkling patterns.

Additionally provided are articles, comprising: a flexible sheet having an uppermost portion, the uppermost portion comprising a plurality of wrinkles having a wavelength of from about 100 nm to about 100 um and an amplitude of from 50 nm to about 20 um.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document. In the drawings:

(FIG. 4A) Large-area 1D wrinkles on a 9 cm wafer using oxygen plasma treatment and sequential rolling. (FIG. 4B)-(FIG. 4C) Scanning electron micrographs of wrinkles in (FIG. 4A).

(FIG. 10A) 1D wrinkles in 36 cm$^2$ area. (FIG. 10B) Optical microscope image of crack-free 1D wrinkles with 61.45 µm wavelength.

DETAILED DESCRIPTION OF ILLUSTRATIVE EMBODIMENTS

Figure 1:
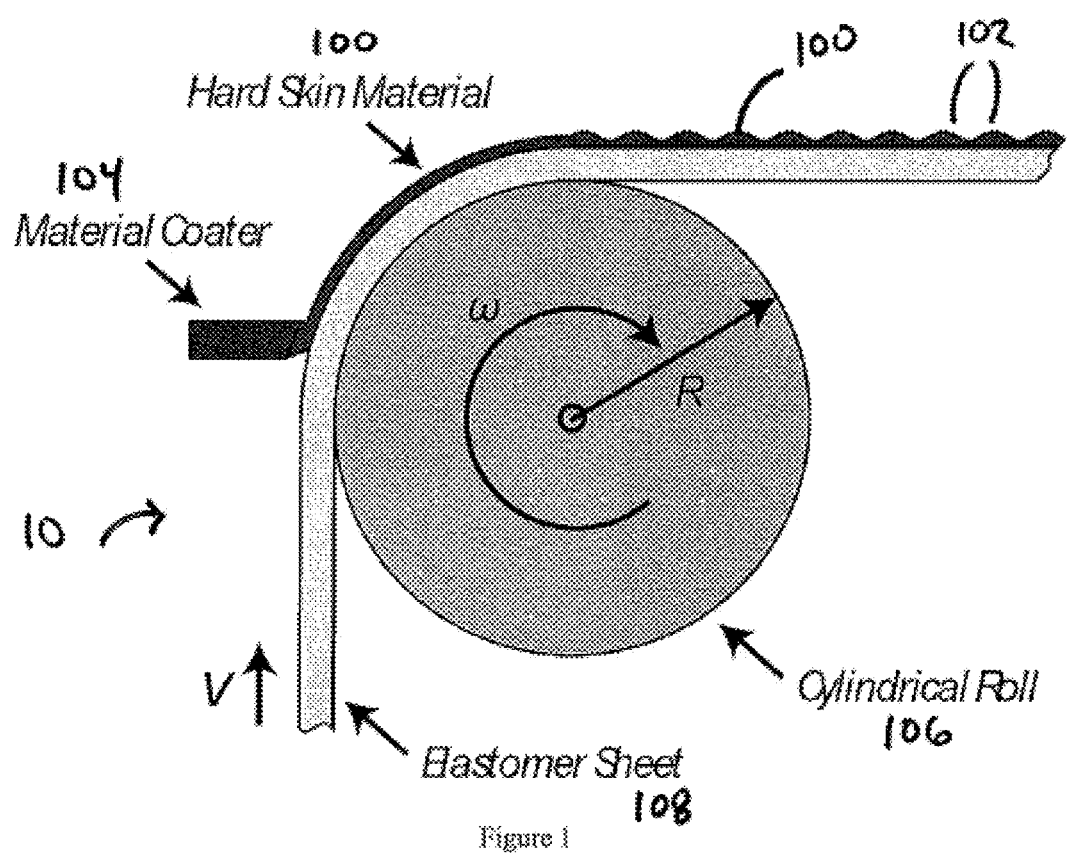
FIG. 1. Scheme for roll-to-roll wrinkle manufacturing.

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints, 2 grams and 10 grams, and all the intermediate values. The endpoints of the ranges and any values disclosed herein are not limited to the precise range or value: they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4. Further, the term "comprising" should be understood as having its open-ended meaning of "including," but the term also includes the closed meaning of the term "consisting." For example, a composition that comprises components A and B may be a composition that includes A, B, and other components, but may also be a composition made of A and B only. Any documents cited herein are incorporated by reference in their entireties for any and all purposes.

Wrinkling is a ubiquitous surface phenomenon that occurs at a wide range of length scales from kilometers to nanometers. Particularly, micro/nano-scale wrinkles have found applications in stretchable electronics, tunable optics and coatings with controlled wettability and adhesions.

Although various techniques including thermal treatment, swelling, mechanical stretching, and UV curing, have been developed for wrinkle fabrication, little attention has been paid for continuous manufacturing over large scale. Provided here is wrinkling on a roller, useful in a scalable roll-to-roll (R2R) manufacturing process. This technique takes advantage of the various geometrical shapes and curvatures defined by the 3D printed rollers to induce well-defined strain fields to manipulate the final wrinkle patterns on compliant polymer substrates.

As an example, a study was done of wrinkle formation on a thick poly dimethylsiloxane (PDMS) film wrapped around a roller, followed by oxygen plasma. The wrinkle features showed some dependence on the geometrical parameters of the roller, thickness of the film, and other processing parameters. Then, continuous wrinkling under ambient conditions was achieved by applying a UV-curable polymer onto PDMS as the skin layer, followed by UV curing along with rotation of the roller. Based on this principle, one-dimensional (1D) gratings, two-dimensional (2D) herringbone and labyrinth patterns over large areas using different roller shapes were demonstrated, with wrinkle wavelengths spanning from hundreds of nanometers to tens of microns. The use of rollers to control the generation of wrinkles provides for R2R manufacturing of surface wrinkles for a wide range of applications.

In this invention, a novel wrinkling mechanism based on roller curvatures is developed for scalable roll-to-roll (R2R) manufacturing of surface wrinkle textures. This technique takes advantage of the various geometrical shapes and curvatures defined by the 3D printed rollers to induce well-defined strain fields to manipulate the final wrinkle patterns on compliant polymer substrates. UV curing and oxygen plasma treatment can be used in this technique, and large-area one dimensional (1D) wrinkles can be made, along with 2- and 3-D wrinkles.

Using oxygen plasma treatment and manual sequential rolling, wrinkles with 3 μm wavelength were fabricated on a 9 cm diameter substrate. Using UV curing, crack-free wrinkles with larger wavelengths between 40 and 60 μm were made in a 36 cm$^2$ area. This technology can be used in continuous R2R manufacturing of wrinkles. 1D gratings, two-dimensional (2D) herringbone and labyrinth patterns can be made using this technique, with feature size from hundreds of nanometers to tens of microns, which are useful for a variety of potential applications.

R2R Wrinkle Using Oxygen Plasma

Figure 2:
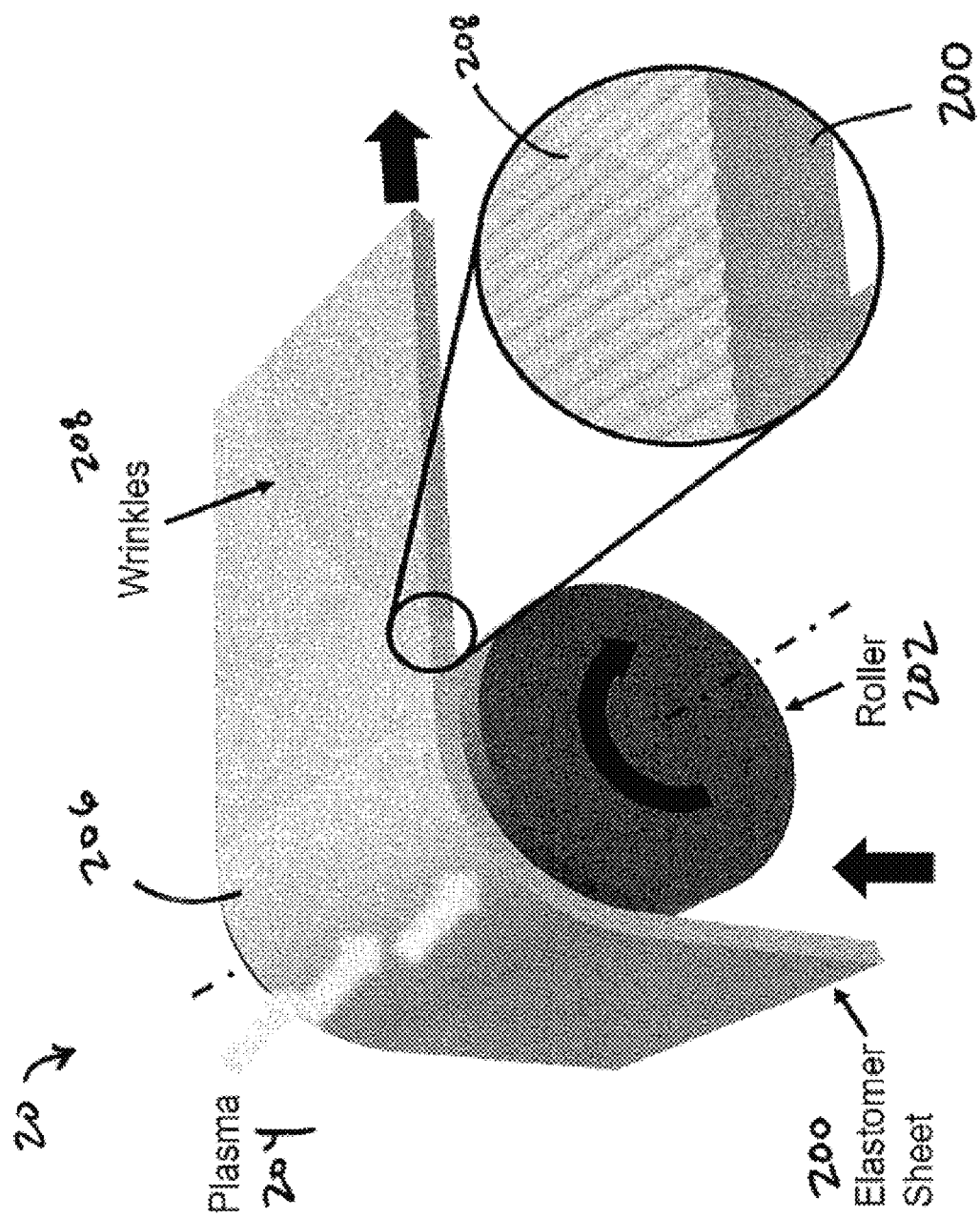
FIG. 2. Scheme for roll-to-roll wrinkle manufacturing using oxygen plasma.

Polydimethylsiloxane (PDMS) was used in one demonstration, as oxygen plasm treatment of prestretched PDMS can generate wrinkles. Instead of using a material coater as depicted in FIG. 1, oxygen plasma was used to treat PDMS which is wrapped around the curved surface of a roller, as shown in FIG. 2.

PDMS was prepared by mixing at a ratio of 10:1 between base and curing agent. The mixture was then degassed for 30 min and cured in oven at 70° C. for 6 hours. The cured PDMS was cut into 1.5 cm wide stripes. The stripes were gently wrapped around the roller, and fixed by tapes. The wrapping process was gentle enough not to generate any additional stretches.

The wrapped PDMS was then treated using an oxygen plasma application. The treatment parameters were 100 W power, 20 sccm flow rate, 200 mTorr vacuum for 3 minutes. After unwrapping PDMS, 1D wrinkles were generated.

Different roller shapes can influence local strain fields, which can lead to different types of wrinkles. 3D printing has been used to make rollers with different shapes. Using oxygen plasma treatment, different wrinkle topologies are characterized by atomic force microscope (AFM).

Figure 3:
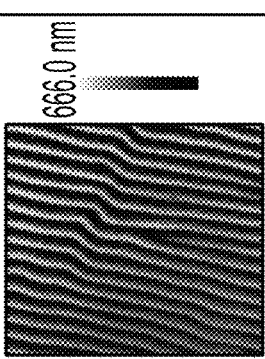
FIG. 3. Wrinkle library with four roller types.

FIG. 3 summarizes the wrinkle types observed using cylinder, football, sphere and donut shapes. For cylinders, strain is induced only uniaxially due to the finite diameter of the cylinder in one direction, and the resulting wrinkles are one-dimensional gratings. For football shapes, herringbone wrinkles are primarily present with some areas of labyrinth disordered wrinkles. As for spheres, labyrinth patterns are more dominant with small areas of herringbone patterns. Herringbone-type wrinkles are also observed using donut shape, but in orthogonal direction compared with football shape.

Figures 4A, 4B, 4C:
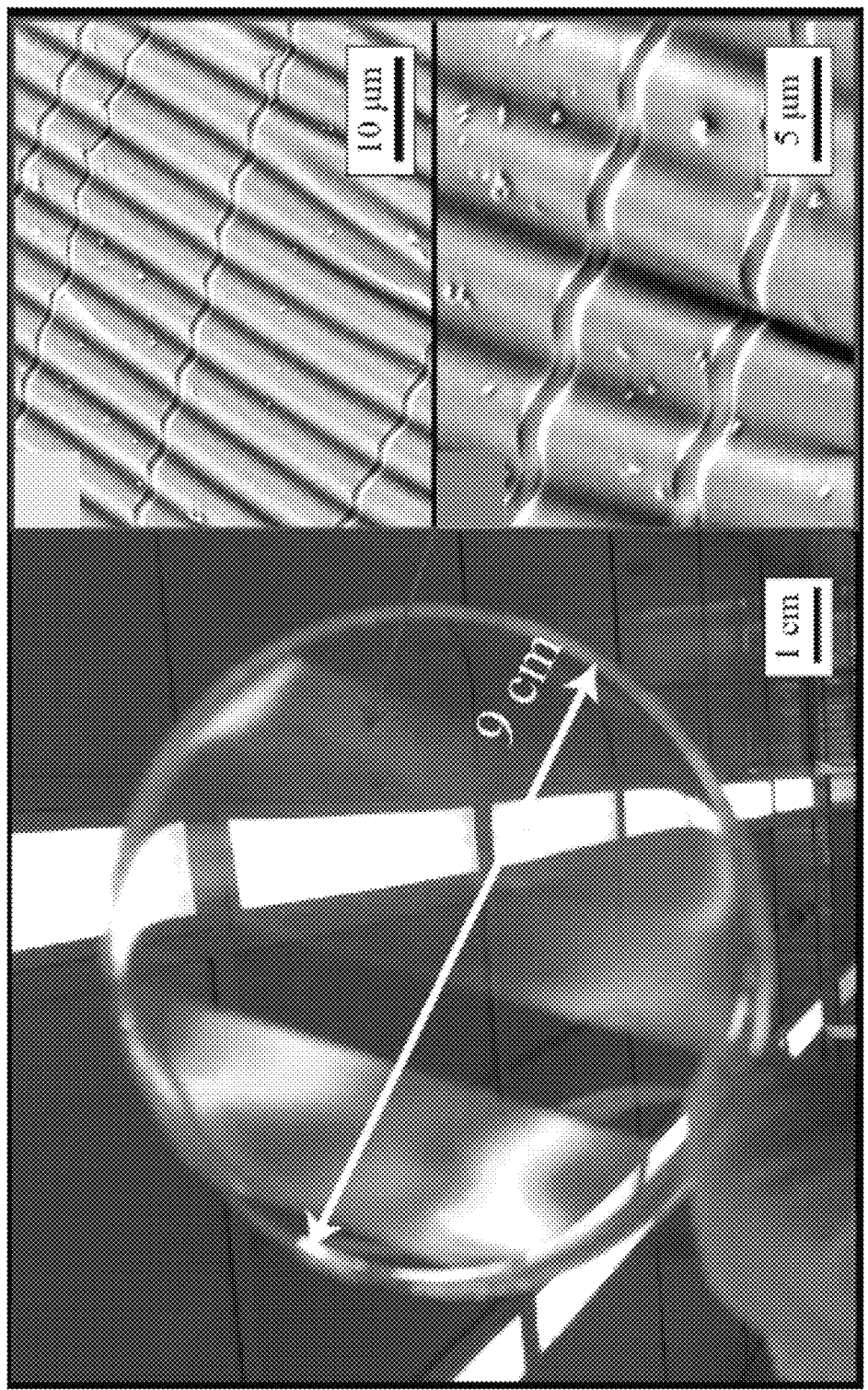
FIGS. 4A-4C.

Using this technique, a large area wrinkle on a 9 cm diameter PDMS wafer is demonstrated by manual sequential rolling, as shown in FIG. 4. It shows the feasibility of achieving large area wrinkles using this invention.

Figure 5:
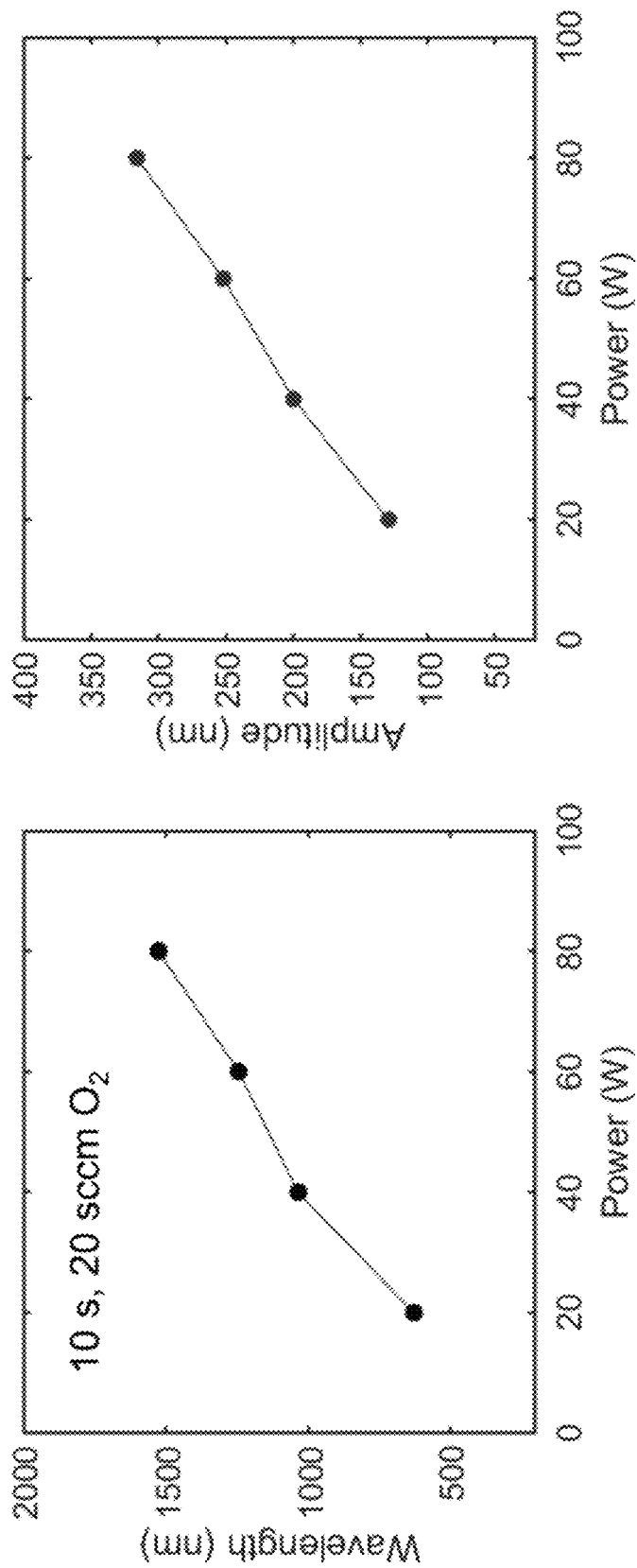
FIG. 5. Plasma power effect on wrinkles.

A range of example experimental parameters and their effects on wrinkles are shown. The parameters are plasma power, plasma treatment time, PDMS thickness, and cylindrical roller diameter. The analyses are restricted to cylindrical rollers. The oxygen plasma power was varied from 20 W to 80 W under same flow rate of 20 sccm and treatment time of 10 s. The wrinkle wavelength and amplitude are shown in FIG. 5 with varied plasma power. Without being bound to any particular theory, the wrinkle wavelength and amplitude increase as plasma power increases. This can be explained by, e.g., the thickening of hard skin layer with increasing plasma power.

Figure 6:
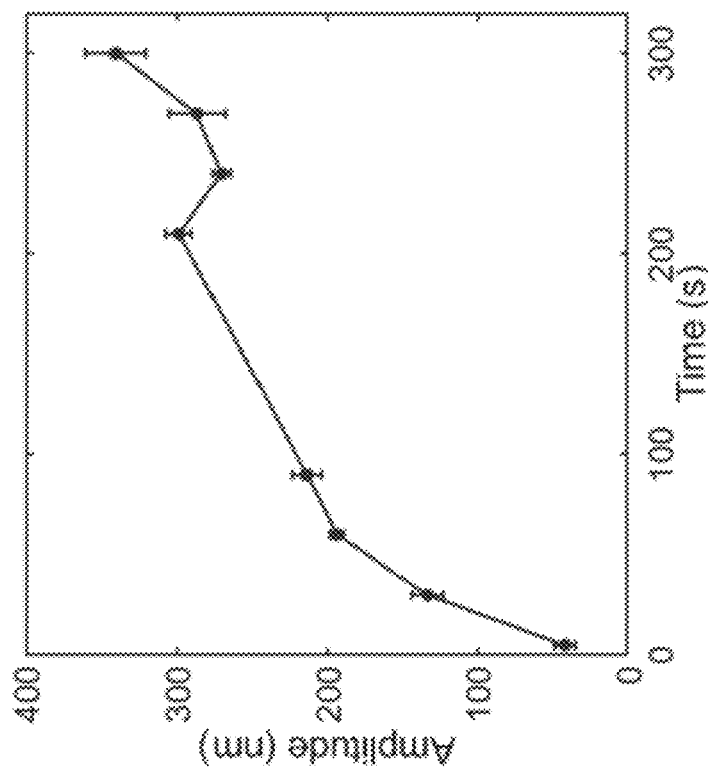
FIG. 6. Plasma treatment time effect on wrinkles.
Figure 6:
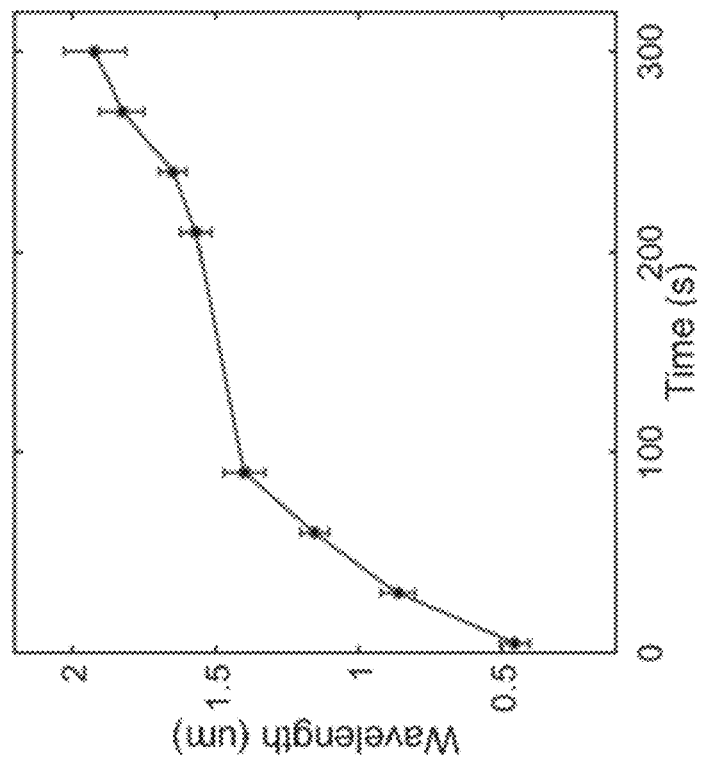

The thickness of the hard skin layer can be further controlled by plasma treatment time. The results are depicted in FIG. 6. Plasma power was fixed at 20 W and oxygen flow rate is 20 sccm. Wrinkle wavelength and amplitude increase linearly at first, and then saturate for longer plasma treatment time. This is an indication that the thickness of hard skin layer follows the same trend. This means that initially the hard skin layer forms linearly with plasma treatment time. After the hard skin layer becomes thick enough, the plasma can encounter more difficulty in diffusing through the hard layer, thus exhibiting saturation.

Wrinkles generated from different cylindrical rollers were investigated. Four rollers with diameters of 5, 10, 15, 20 mm were printed using 3D printing. Since PDMS thickness is important in determining the prestrain level, 1, 2, and 3 mm thick PDMS sheets were fabricated.

Figure 7:
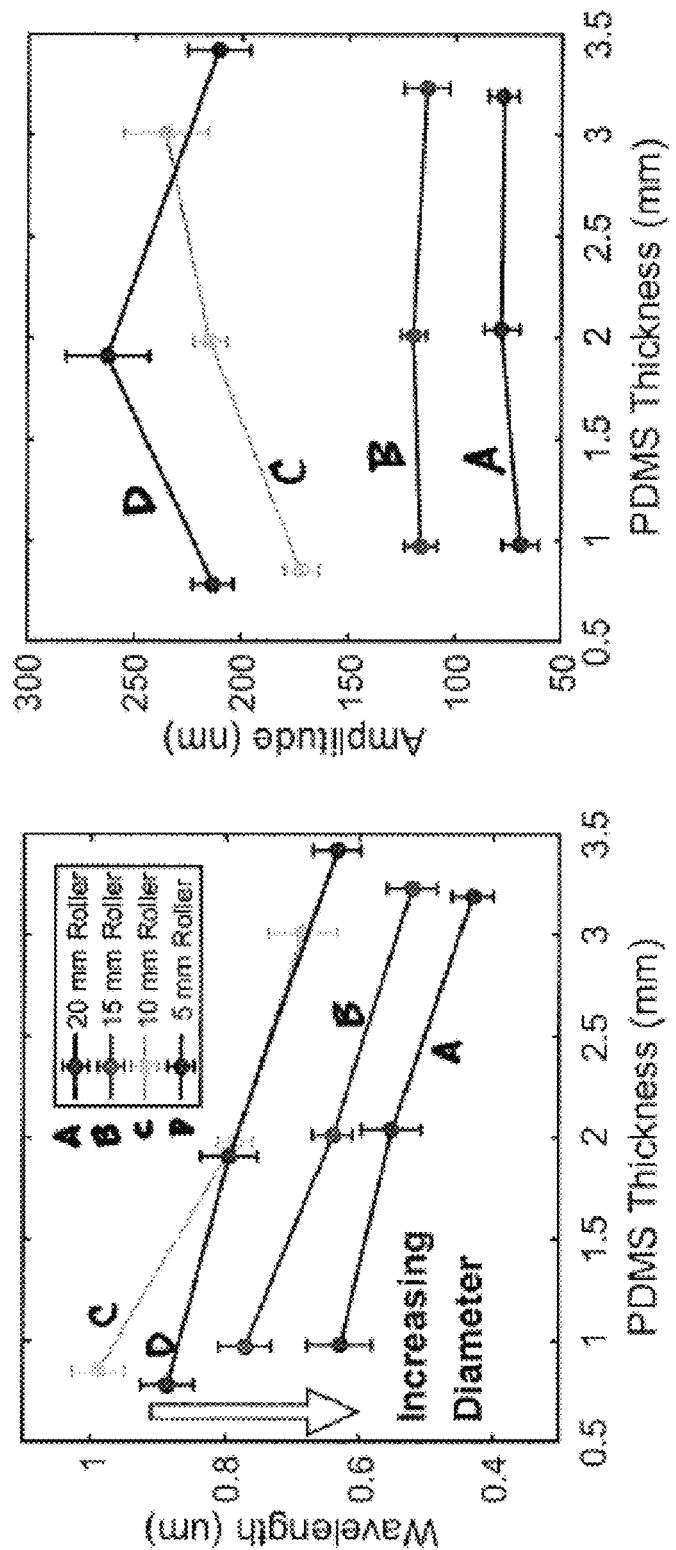
FIG. 7. PDMS thickness effect on wrinkles generated from cylindrical rollers with four diameters.

Wrinkle wavelength and amplitude are plotted against PDMS thickness and roller diameter in FIG. 7. The plasma treatment parameters were fixed at 20 W, 20 sccm oxygen, 200 mTorr and 30 s. In FIG. 7, wavelength shows a clear decreasing trend with increasing PDMS thickness. For first-order approximation of PDMS bending, prestrain is larger for thicker PDMS. This wrinkle wavelength trend is consistent with nonlinear wrinkle theory where wavelength decreases with increasing prestrain level. Using oxygen plasma, wrinkles with wavelengths from 400 nm to 3 µm were achieved using this invention. One can integrate a roll-to-roll system with a plasma etcher to achieve R2R wrinkle manufacturing.

R2R Wrinkle Using UV-Curable Polymers

Figure 8:
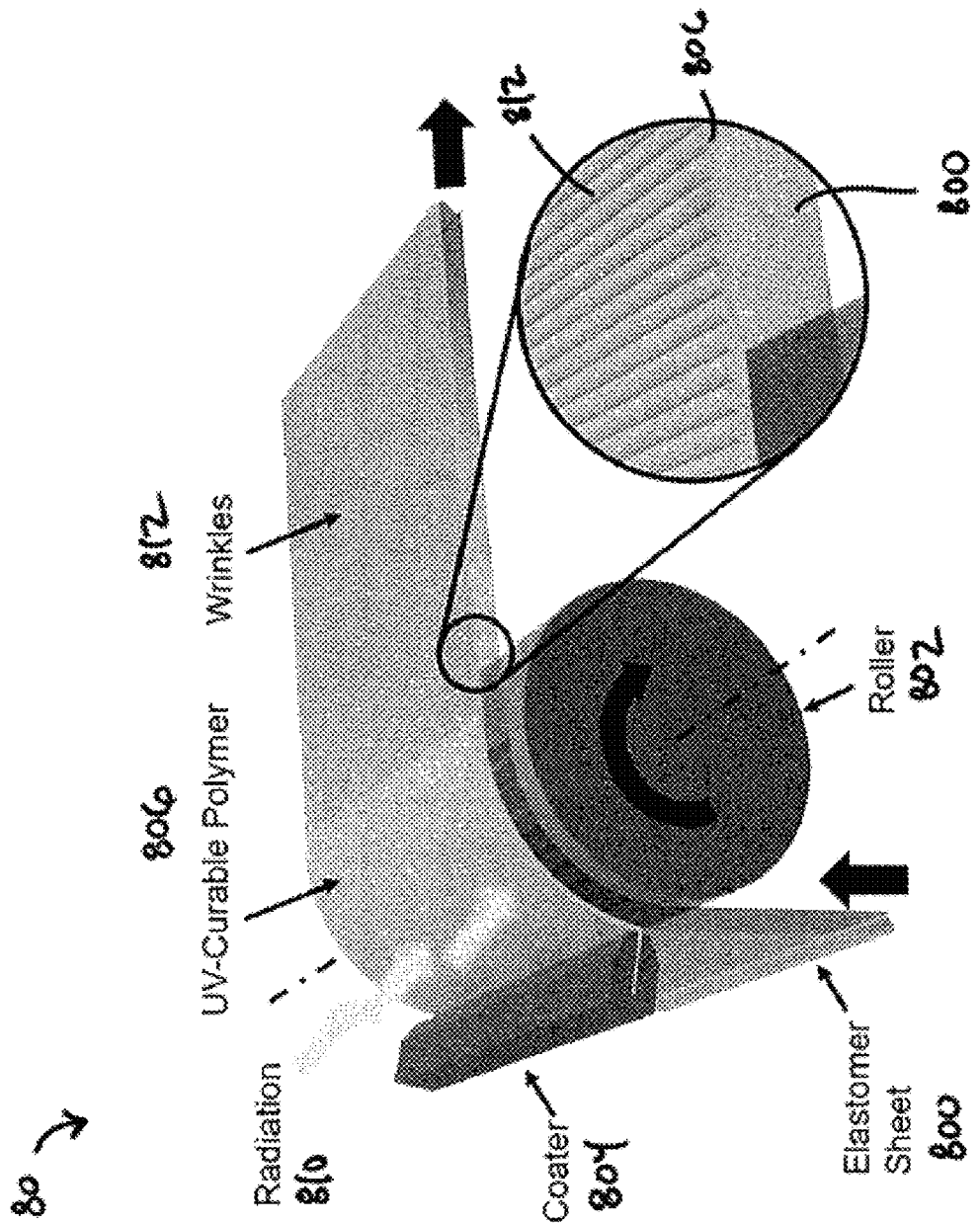
FIG. 8. Scheme for UV-induced wrinkle manufacturing.

To scale up wrinkle manufacturing, it is useful to have a system that can operate under ambient conditions without expensive and complex vacuum systems such as plasma etcher. Meanwhile, the manipulation of light is well understood and established under ambient conditions. Here a UV-induced R2R wrinkle system is shown, as depicted in FIG. 8. In one non-limiting example, the elastomeric substrate is PDMS, and the top skin layer is UV-curable polymer, applied with proper coating techniques, such as spin coating, slot coating, doctor blade coating, and the like. The bilayer is then wrapped around the roller and cured using UV light.

Figure 9:
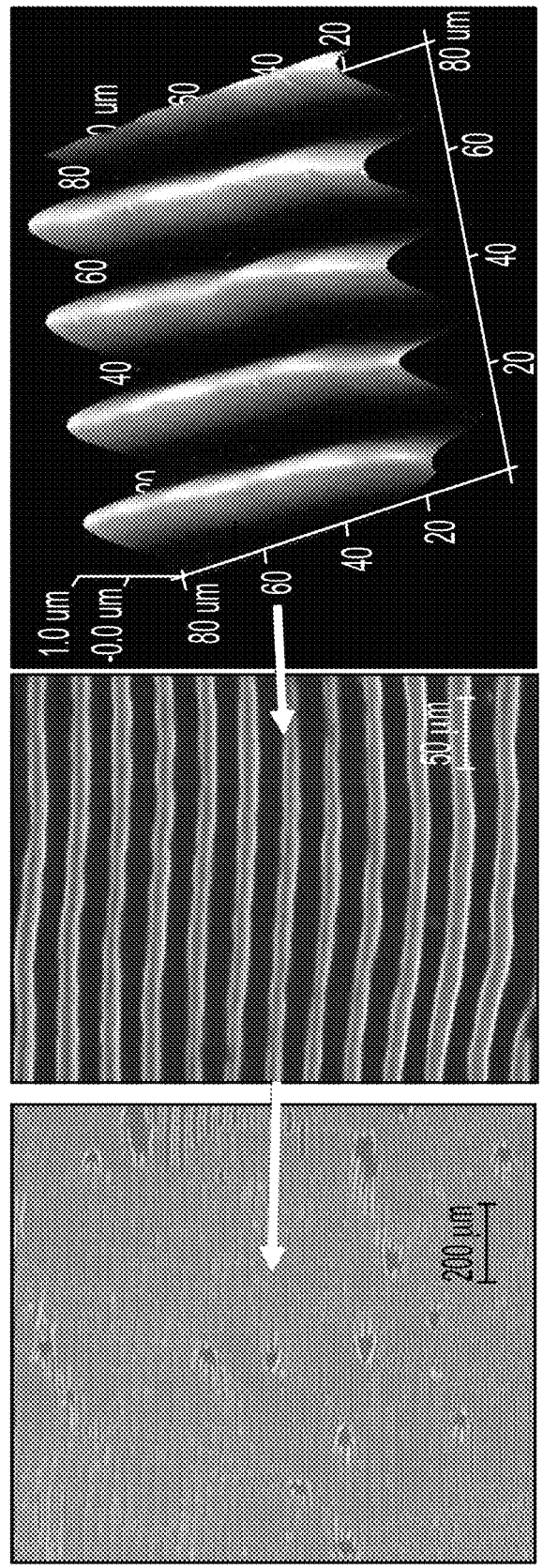
FIG. 9. UV-induced wrinkle using UV curable PDMS.

A bilayer system according to the present disclosure can be constructed such that the substrate and the second material (sometimes termed the skin layer) have strong bonding therebetween. As one example, KER 4690 from Shin-Etsu, a UV-curable PDMS, showed bonding to PDMS. Large wrinkles were generated upon UV curing using a 15 mm roller, as depicted in FIG. 9. The UV-curable polymer was spincoated on untreated PDMS under 5000 rpm for 1 min.

The thickness of UV-curable polymer is about 30 µm according to material data sheet. The resulting wrinkle wavelength is about 28 µm and amplitude is 3 µm from AFM scans. To further reduce wrinkle wavelength, a 1:1 diluted solution with KER 4690 and toluene was used. Wrinkle wavelength was further reduced to 18.5 µm with 1.6 µm amplitude. The data is summarized in Table 1 below. Further dilutions can be used to reduce wrinkle size down to nanoscale.

Wrinkles of tens of microns can be consistently fabricated using UV-curable polymers as skin layer and PDMS as substrate. This bilayer system can be used in R2R wrinkle manufacturing.

| Dilution Ratio (PDMS:Toluene) | Wave length (um) | Amplitude (um) |
| --- | --- | --- |
| Pristine | 28.0 | 3.0 |
| 1:1 | 18.5 | 1.6 |

Table 1: UV-Induced Wrinkles with Different Dilution Ratios.

Figures 10A, 10B:
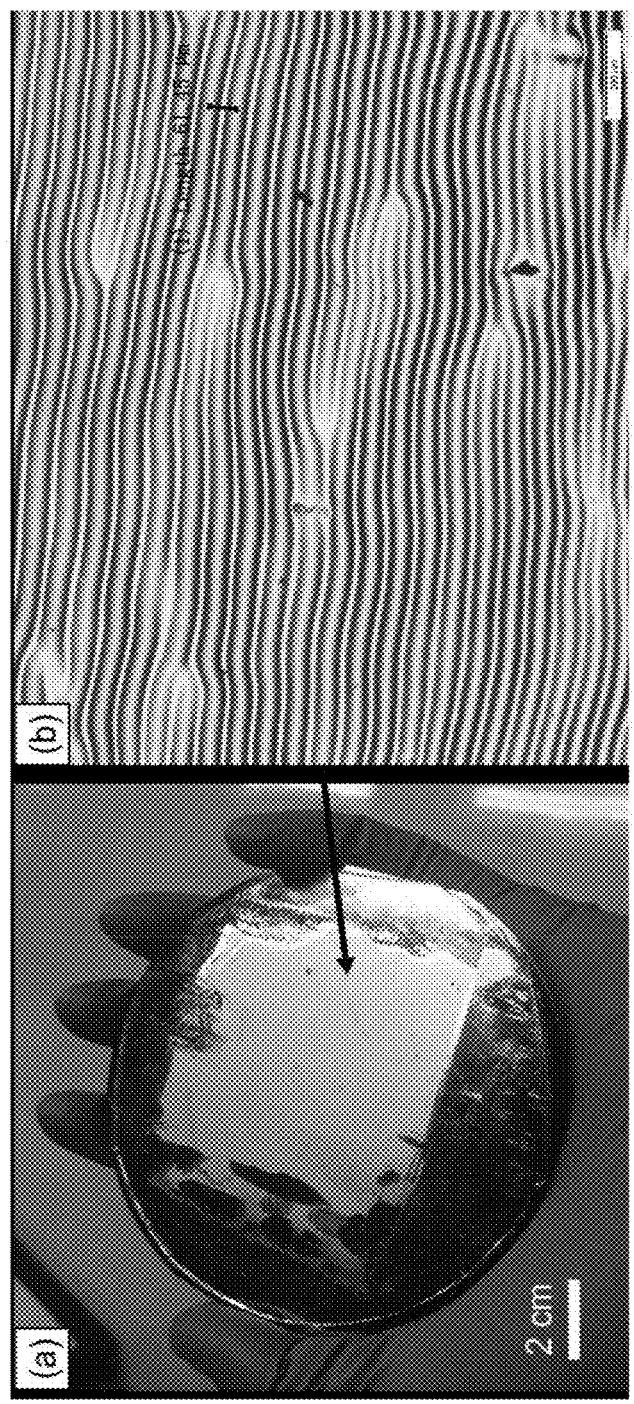
FIGS. 10A-10B.

As a further demonstration of the scalability of this invention, 1D wrinkles in a 36 cm$^2$ area were manufactured using a UV-curable polymer as a skin layer, as shown in FIG. 10. The photo in FIG. 10A shows a square area of wrinkles on PDMS substrate. The silicon wafer served only as a support and simultaneously enhances contrast for better image quality: the silicon wafer is not required. FIG. 10B shows the optical microscope image of 1D wrinkles with 61.45 µm wavelength. It was observed that no cracks are present on the whole area due to the compliant top layer after UV curing.

Further Discussion

As provided herein, the present disclosure presents, inter alia, R2R manufacturing techniques (which can be performed in a continuous manner) for forming surface wrinkles, e.g., by using rollers to control the generation of wrinkles. Illustrative results show the applicability of the disclosed techniques to large-scale applications of wrinkle textures.

As described, introduced here is curvature-induced buckling as a scalable method of surface wrinkle formation. This technique takes advantage of the well-defined bending strain that is applied on a surface by wrapping a sample (e.g., a bilayer PDMS sample) of two different stiffnesses around a cylindrical or other revovable surface. Upon releasing of the curvature-induced strain from a bilayer, wrinkles of different surface topographies are produced, including one-dimensional (1D) sinusoidal wrinkles and two-dimensional (2D) checkboard patterns.

Taking advantage of the cylindrical support that induces curvature-induced buckling, a roll-to-roll (R2R) system is used for continuous manufacturing of surface wrinkles. As but one application, the utility of R2R-manufactured surface wrinkles as a light scattering layer is demonstrated by substantial enhancement of light harvesting and thus the energy conversion efficiency of solar cells under oblique angles of solar illumination.

Owing to its low cost, high speed, and versatility, R2R manufacturing is widely used in industry for large-scale production of various sheet/membrane/paper-based products. An exemplary system can include, e.g., two cylindrical rollers, an elastomeric web, a UV light source, and a driving motor.

In an exemplary embodiment (FIG. 19A), an elastomeric substrate made of PDMS (Sylgard 184) is first spin-coated with a thin layer of UV-curable PDMS. The bilayer sheet is wrapped onto a cylindrical roller, experiencing bending strain. By impinging UV/O$_3$ light onto the bilayer, the wrapped portion of UV-PDMS was cured and hardened. Here, the UV/O$_3$ light is chosen because of its high-energy flux (185 and 254 nm wavelength peaks) that facilitates rapid curing of UV-PDMS, resulting in a high degree of crosslinking.

Upon the rotation of the roller, the strain is released as the bilayer flattens, leading to the formation of surface wrinkles which can be easily observed with the naked eye. The bonding between the two layers is large enough to prevent delamination during wrinkling. This can be attributed to the similar chemical compositions of the two polymer layers.

Figure 19A:
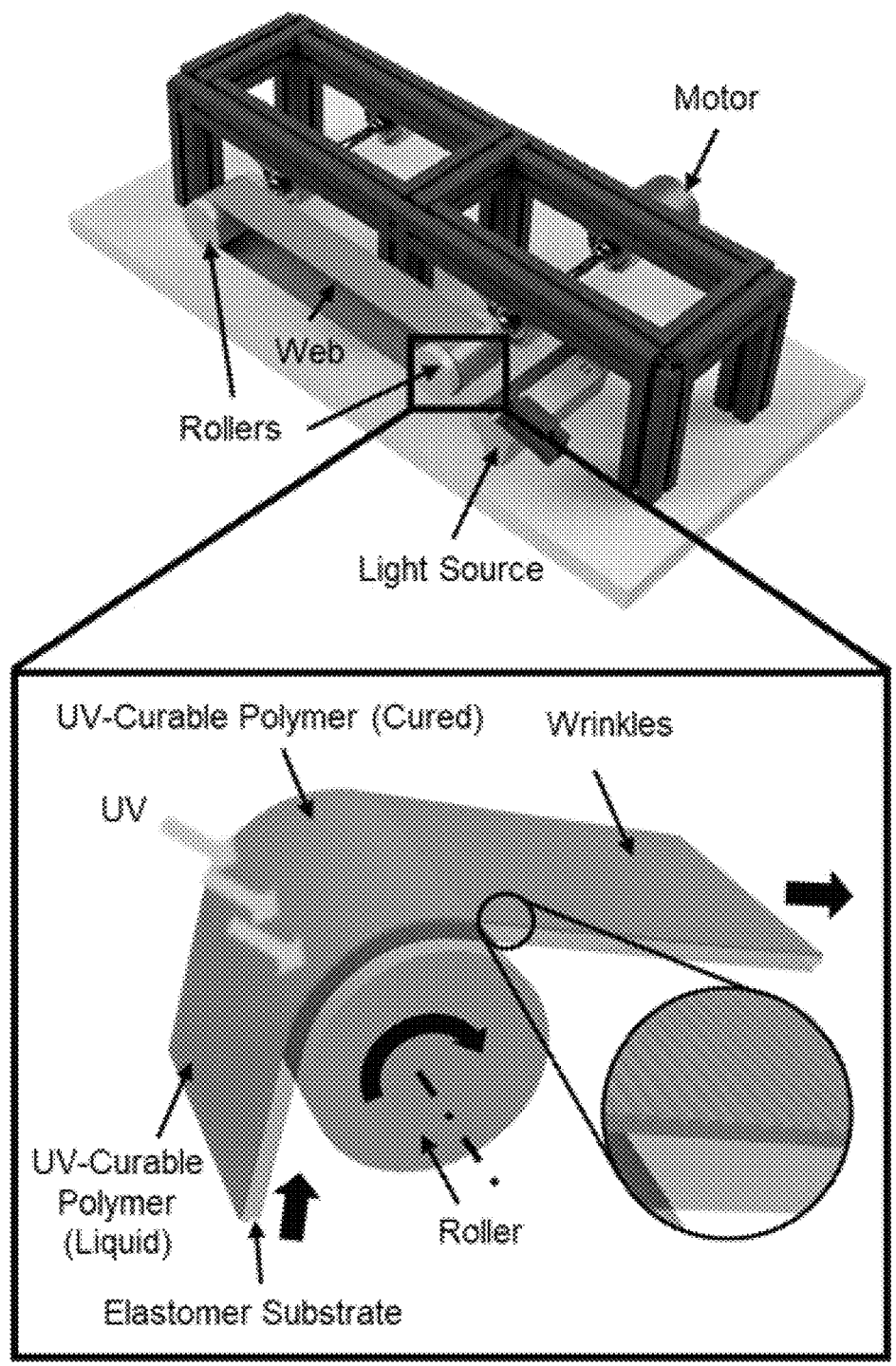
FIGS. 19A-19B provide views of an exemplary system and an illustrative wrinkling mechanism.
Figure 19B:
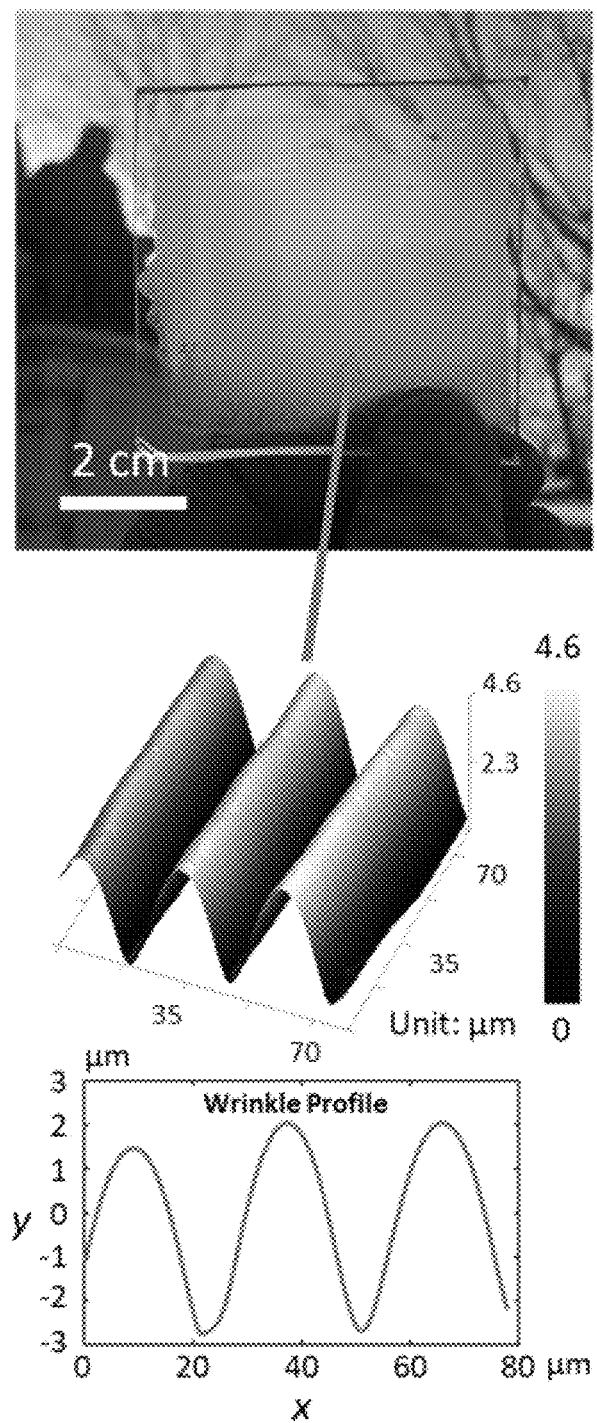

Based on this prototype, a 4 cm×4 cm wrinkle sample was fabricated as shown in FIG. 19B. The wrinkled region, which covers extensive areas of the sample, appears hazy (upper portion of FIG. 19B) on a transparent PDMS substrate due to light scattering, which can be used to enhance light harvesting of solar cells under oblique angle of illumination. FIG. 19B (middle portion) shows the atomic force microscope (AFM) image and the cross-sectional profile of the surface wrinkles shown in the upper portion of FIG. 19B. As shown, 1D sinusoidal surface wrinkles are apparent with 4.6 µm height and 28.0 µm wavelength.

For a given polymer thickness, the bending strain in the cured polymer should depend on the roller curvature (i.e., diameter) and the substrate thickness. To understand the effect of these two processing conditions, we prepare cylindrical rollers with diameters ranging from 8 mm to 30 mm using 3D printing. The thickness of PDMS substrate is varied from 1 mm to 4 mm. UV-PDMS thickness is fixed at ~10 µm. The bilayer films are then gently wrapped around a roller and fixed with adhesive tape at both ends.

Figure 20:
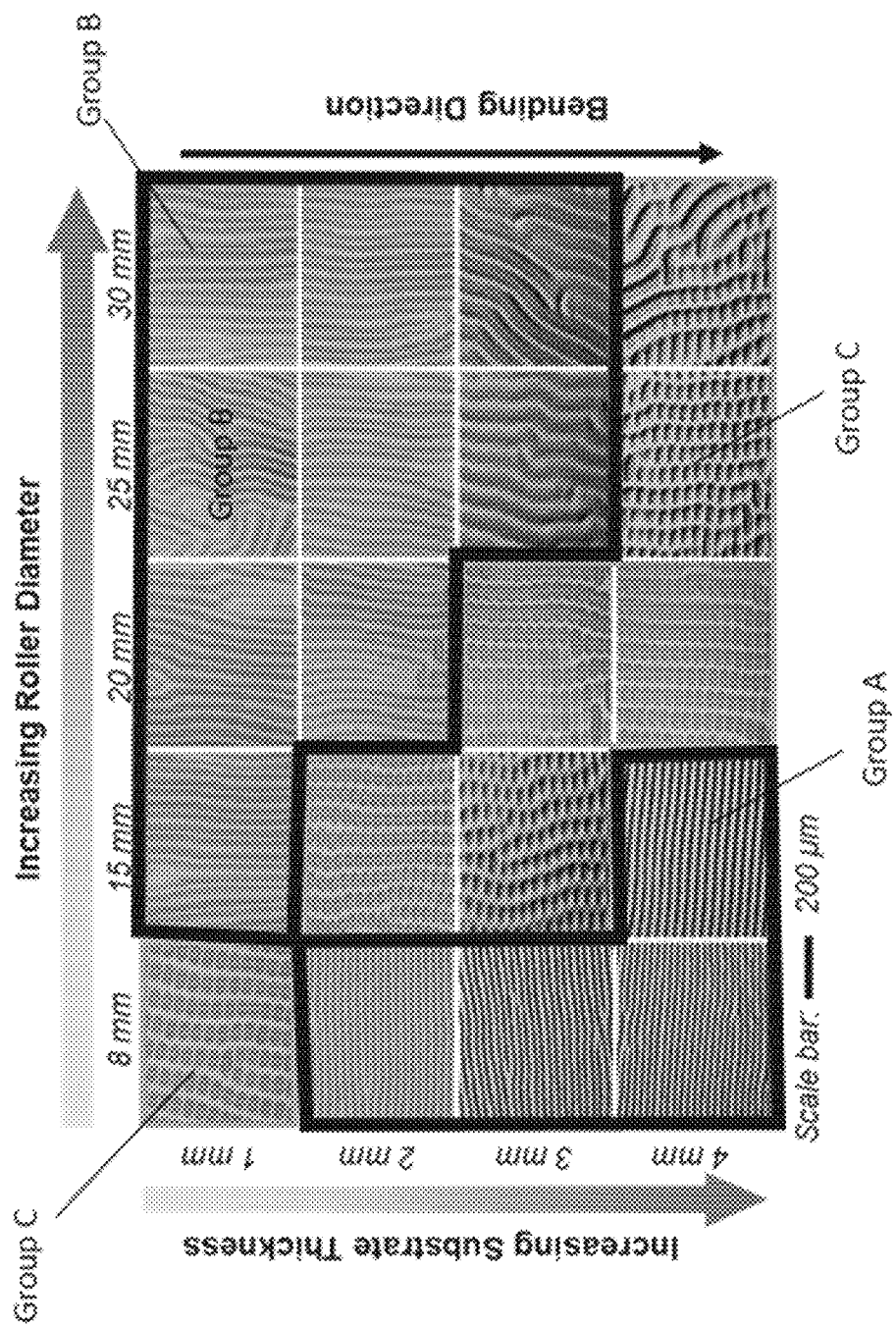
FIG. 20 provides a wrinkle library, illustrating the versatility of the disclosed technology.

From the optical microscope images shown in FIG. 20, three types of wrinkle patterns (grouped using red (A), green (C) and orange (B) outlines) are observed under different combinations of substrate thickness and roller diameter. Group red (A) has 1D wrinkles formed perpendicular to the bending direction. Group orange (B) also has 1D wrinkles but more or less in parallel to the bending direction. These 'parallel' wrinkles have larger periods than the 'perpendicular' wrinkles. In the intermediate region represented in green (C), 2D 'checkerboard' wrinkles are obtained, which can be regarded as the superposition of the parallel and perpendicular wrinkles. Because the wrinkle wavelengths in the two directions are different, the checkerboard dots appear elliptical with long axes perpendicular to the bending direction and short axes parallel to the bending direction.

Based on the buckling mechanism, the release of curvature-induced strain along the bending direction in the bilayer should give rise to perpendicular wrinkles, which is indeed the case of wrinkles in the red group. To understand the two other types of surface wrinkles, 2D finite element analysis (FEA) using ABAQUS was carried out to determine the bending strain field within the elastomer substrate as shown in the left panel of FIG. 3 (see details on FEA simulation in the Experimental Section). Since the UV-PDMS coated on the PDMS substrate is liquid when the bending strain is applied, it is not explicitly included in the FEA simulation. No friction is considered in the contact area as the roller is stationary and the film is gently laid on the roller surface without experiencing friction. FEA shows that the maximum tensile strain occurs at the top substrate surface, providing the pre-strain to form surface wrinkles upon release of the bilayer from the cylindrical roller.

According to the bilayer buckling theory, wrinkle wavelength is directly related to the Young's modulus ratio between the bilayer system, $$\lambda = 2\pi h \left(\frac{\overline{E}_f}{3\overline{E}_s}\right)^{1/3} \quad (1)$$

where $\lambda$ is wrinkle wavelength, h is top layer thickness, $\overline{E}_f = E_f/(1-v_f^2)$ and $\overline{E}_s = E_s/(1-v_s^2)$, $E_f$ and $E_s$ are the Young's moduli for the top and the substrate layers, respectively, $v_f$ and $v_s$ are the Poisson's ratios for the top and the substrate layers, respectively. From the observations in FIG. 20, 1D surface wrinkles with orthogonal orientations (red (A) and orange (B) groups) exhibit very different wavelengths and height.

A cursory application of Equation 1 to a bilayer system of UV-PDMS on PDMS with the top layer thickness held constant suggests that the cured UV-PDMS film could exhibit anisotropy in Young's modulus in orthogonal directions. Without being bound to any particular theory, this scenario is highly unlikely because no anisotropy in cured UV-PDMS is observed in scanning electron microscope (SEM) images in orthogonal cross sections.

Figure 21A:
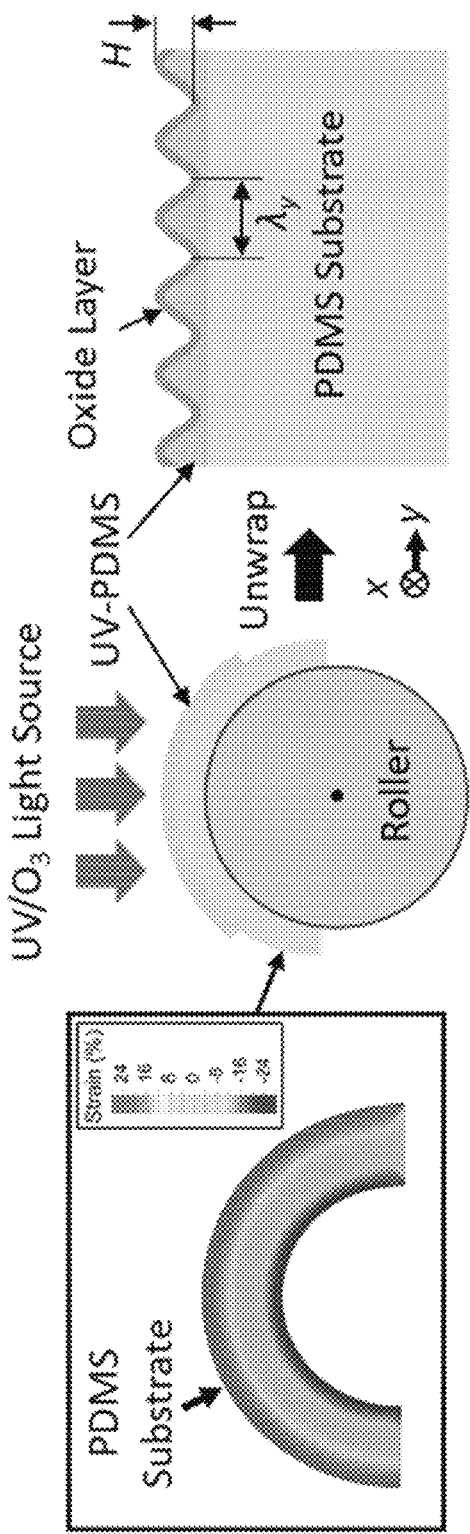
FIGS. 21A-21C provide an illustration of various, non-limiting wrinkle configurations.
Figure 23A:
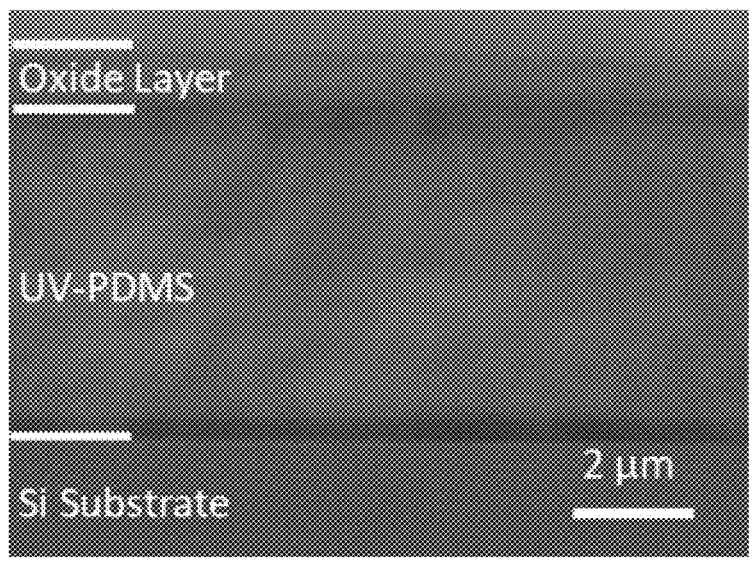
FIGS. 23A-23B provide scanning electron microscope (SEM) images of example materials made according to the present disclosure.
Figure 23B:
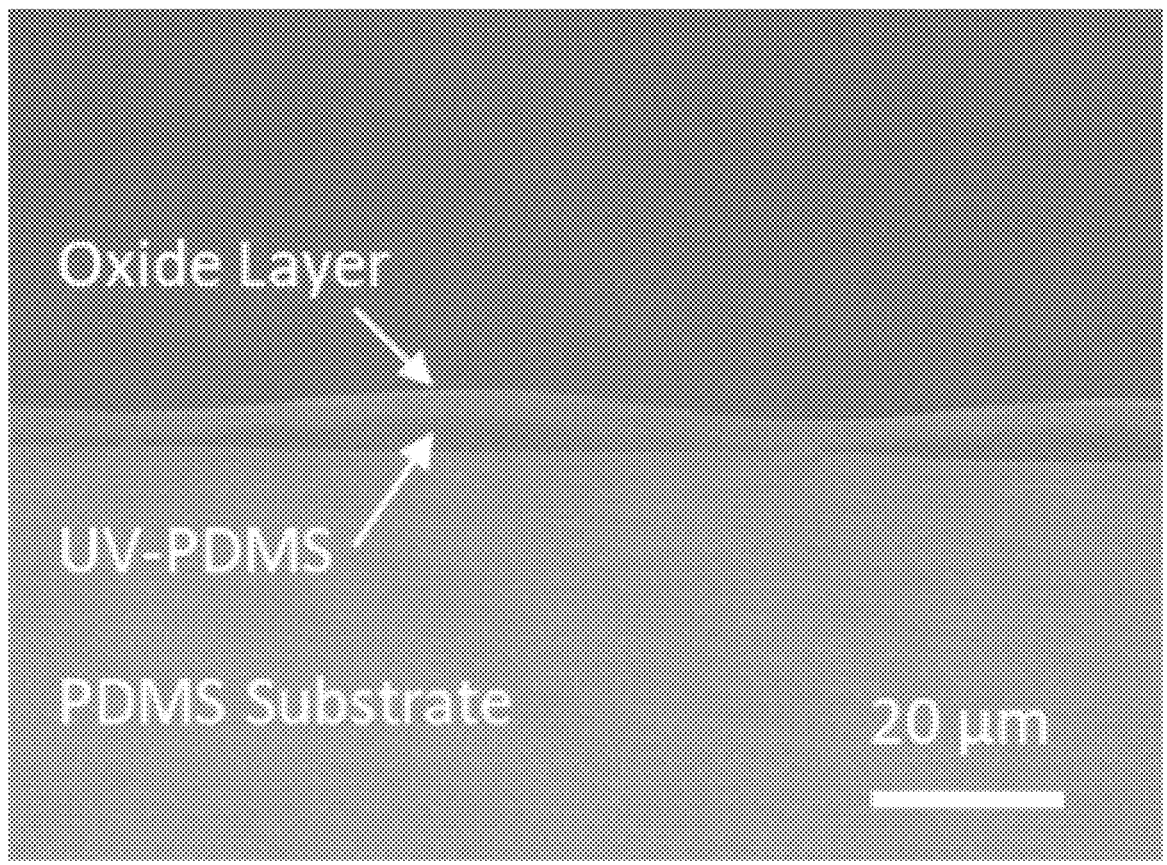

A closer examination of the wrinkling system using SEM reveals that an oxide layer exists on top of UV-PDMS, resulting from the UV ozonolysis, which is harder than the cured UV-PDMS immediately below the oxide layer (FIG. 23). Therefore, strictly speaking, the system consists of a trilayer. However, wrinkled structures are only observed in the UV-PDMS layer while the PDMS substrate remains flat (FIG. 23B: right panel in FIG. 21A). Therefore, one can treat the system as a trilayer system of oxide layer and UV-PDMS layer atop the PDMS substrate to provide insights on the wrinkling mechanism.

Figure 21B:
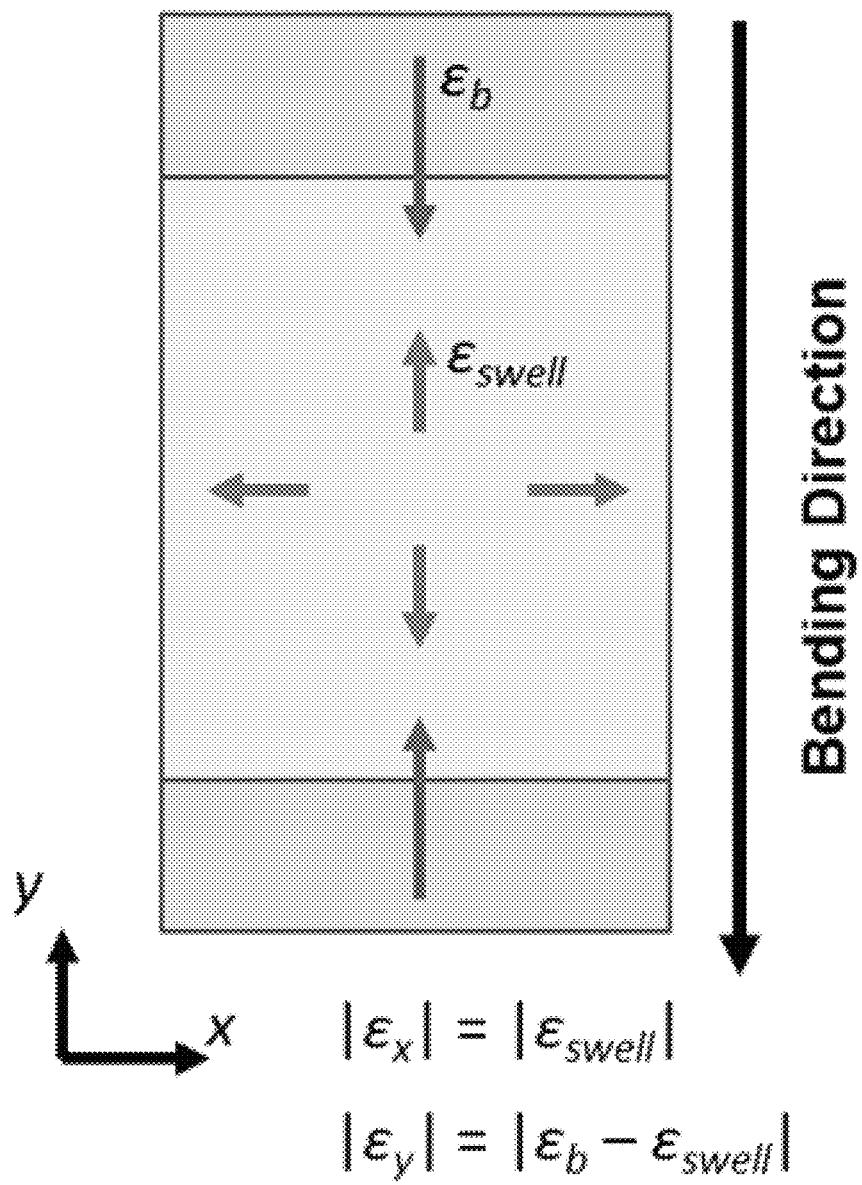

The strain analysis in FIG. 21B reveals two major sources of pre-strain for wrinkle formation. The bending strain, due to roller curvature, is parallel to the bending direction. Deposition and subsequent curing of UV-PDMS induce swelling of the PDMS substrate and compression of the UV-PDMS film substrate, respectively. This sequence of events, we believe, exerts an equibiaxial strain that plays an important role in the formation of the parallel and checkerboard wrinkles. The interplay between these two sources of strain determines the dominant wrinkling modes as seen in FIG. 20.

When the bending strain is small enough to cancel the swelling strain in the y direction, the swelling strain in the x direction is dominant so that total strain in x, $|\varepsilon_x|$, is significantly larger than the total strain in y, $|\varepsilon_y|$. Under such conditions, Y wrinkles (parallel to the bending direction) occur, as shown in the left region of the plot in FIG. 21C. As the bending strain increases to the range where $|\varepsilon_x|$ becomes comparable to $|\varepsilon_y|$, checkboard wrinkles appear, as shown in the middle region of FIG. 21C. Without being bound to any particular theory, checkerboard wrinkles occur when pre-strain just exceeds critical buckling strain, according to the established theory, which explains the narrow window of bending strains (~5%) that leads to the formation of checkerboard wrinkles in FIG. 21C. When bending strain further increases, the bending strain dominates so that X wrinkles (perpendicular to bending direction) are present, as shown in the right region of FIG. 21C.

As discussed above, an oxide layer forms shortly after UV/$O_3$ exposure: that is, the ozone oxidation occurs while the bulk of the UV-PDMS layer is not fully cured and thus remains soft. This situation leads to large Young's modulus ratio between the oxide layer and the partially cured UV-PDMS layer. From Equation 1, this large Young's modulus ratio leads to large wrinkle wavelength upon release of swelling strain. As the bottom UV-PDMS layer is further cured in the later wrinkling stages, the surface wrinkles with large wavelengths become 'locked in'. However, in the bending-dominant region where X wrinkles occur, the bending strain is released only after the UV-PDMS layer is fully cured, when the Young's modulus difference is small, resulting in smaller wrinkle wavelengths.

Figure 24:
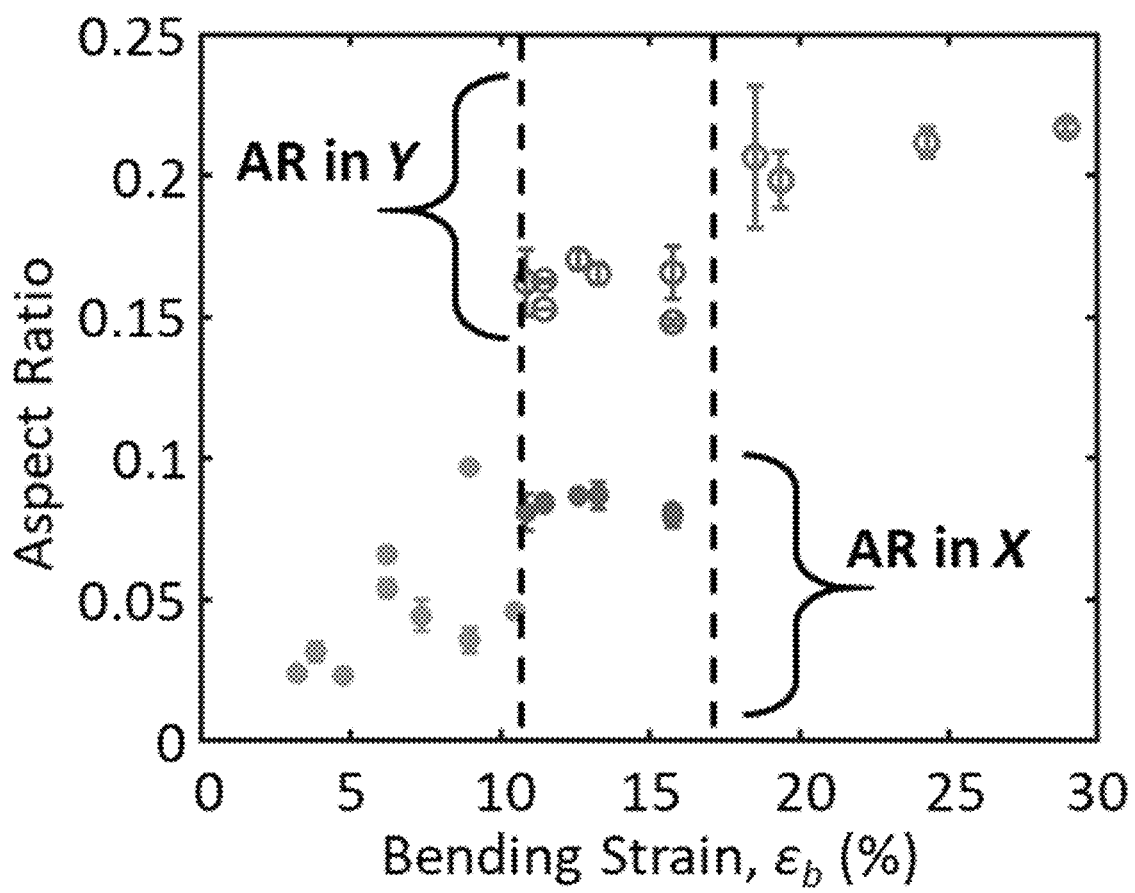
FIG. 24 provides a plot of example surface wrinkle aspect ratio values.

Exemplary wrinkle aspect ratios (height-to-wavelength ratio) are plotted against the bending strain in FIG. 24, where the higher the bending strain, the larger the aspect ratio. These results indicate that by controlling the conditions under which pre-strain and curing/UV radiation are applied, wrinkle topography can be tailored over large areas Wrinkles can have aspect ratios (height-to-wavelength) at zero strain (in either the x- or y-directions) of from about 0.01 to about 10, or from about 0.05 to about 8, or from about 0.15 to about 6, from about 0.2 to about 4, from about 0.25 to about 3, or even from about 0.3 to about 2, though the foregoing listing is not exhaustive or exclusive.

As but one example of the utility of the disclosed technology, one can use large-area surface wrinkle films as optical diffusers for solar cells. With flat surfaces, reflection loss of solar light increases at oblique angles, reducing light absorption and thus conversion efficiency. One potential solution is to employ solar tracking systems so that the solar panels follow the movement of the sun to reduce reflection loss and ensure maximum solar light absorption. This method, however, intrinsically requires use of energy, which effectively lowers the net power yield from the solar panels.

One way to operate solar cells without the need for such a tracking system is to use optical diffusers. Surface wrinkle films, as additional top layers between air and solar cell, could potentially increase optical absorption by redirecting photons into oblique directions so that the resultant solar cell output can be enhanced. In FIG. 22B, the transmission and reflection of a 1D wrinkle film (wavelength of 28.0 μm and height of 4.6 μm) are shown from measurements using an integrating sphere and a UV-Vis-NIR spectrophotometer with normal incidence. Diffuse transmission due to scattering accounts for roughly 50% of the transmitted light, which suggests that these surface wrinkles can indeed function as effective optical diffusers. The scattering pattern of the 1D wrinkle in FIG. 22C shows that scattering light are mainly from diffraction orders.

The power conversion efficiency of the wrinkle-capped single crystalline silicon solar cell (FIG. 22C) is characterized under varying angles of solar illumination. The current-voltage (I-V) curves from the wrinkle-capped solar cell are recorded at incident angles from 0° to 70°.

Figure 22A:
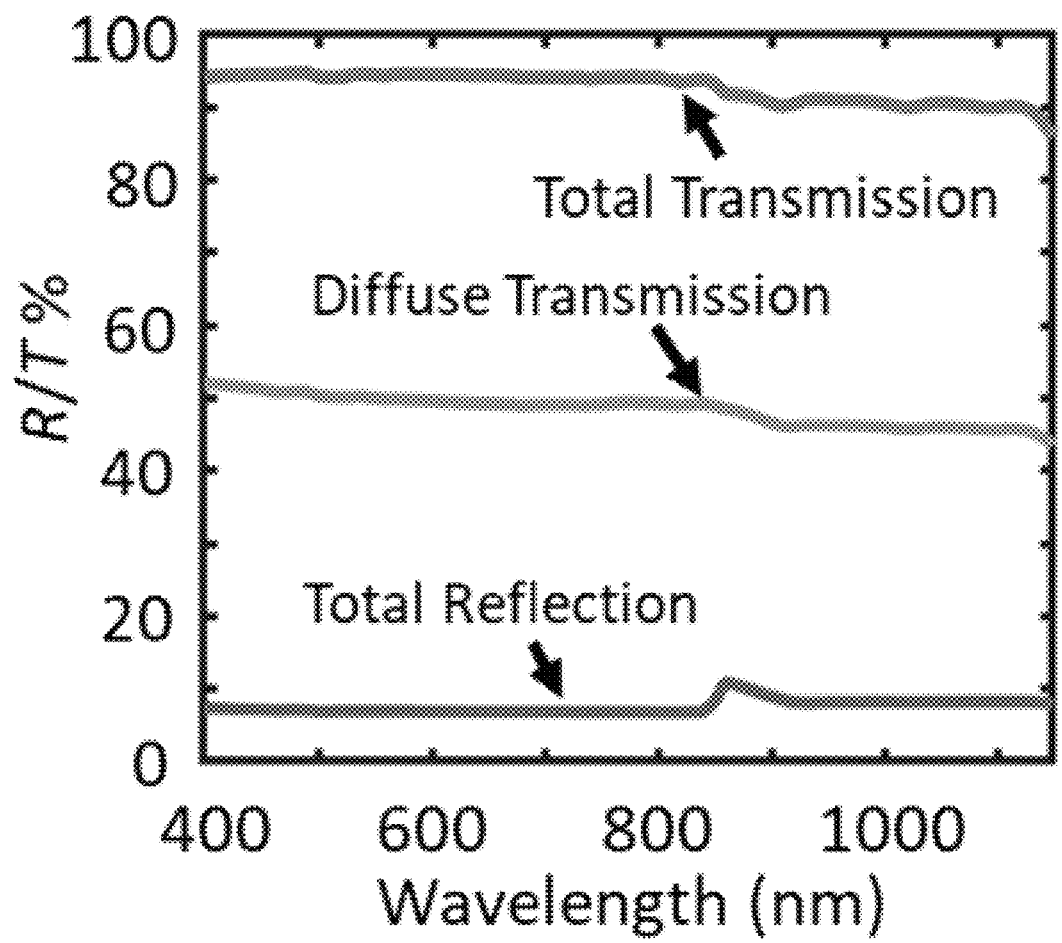
FIGS. 22A-22E provide optical properties of various, non-limiting wrinkle configurations.
Figure 22B:
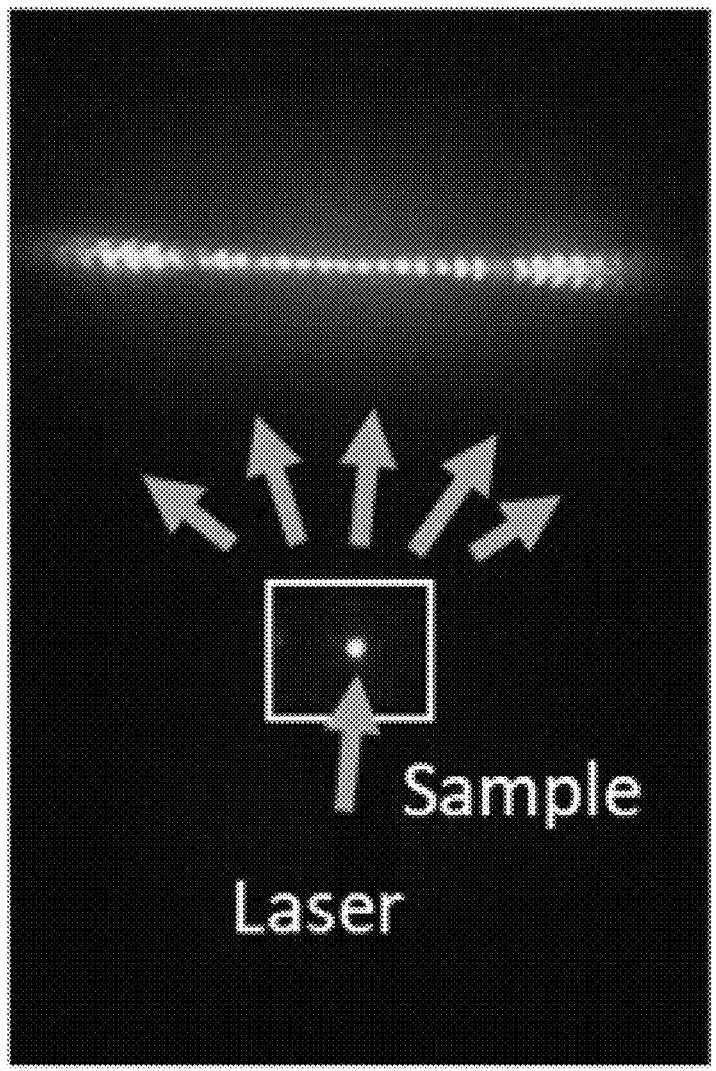
Figure 22C:
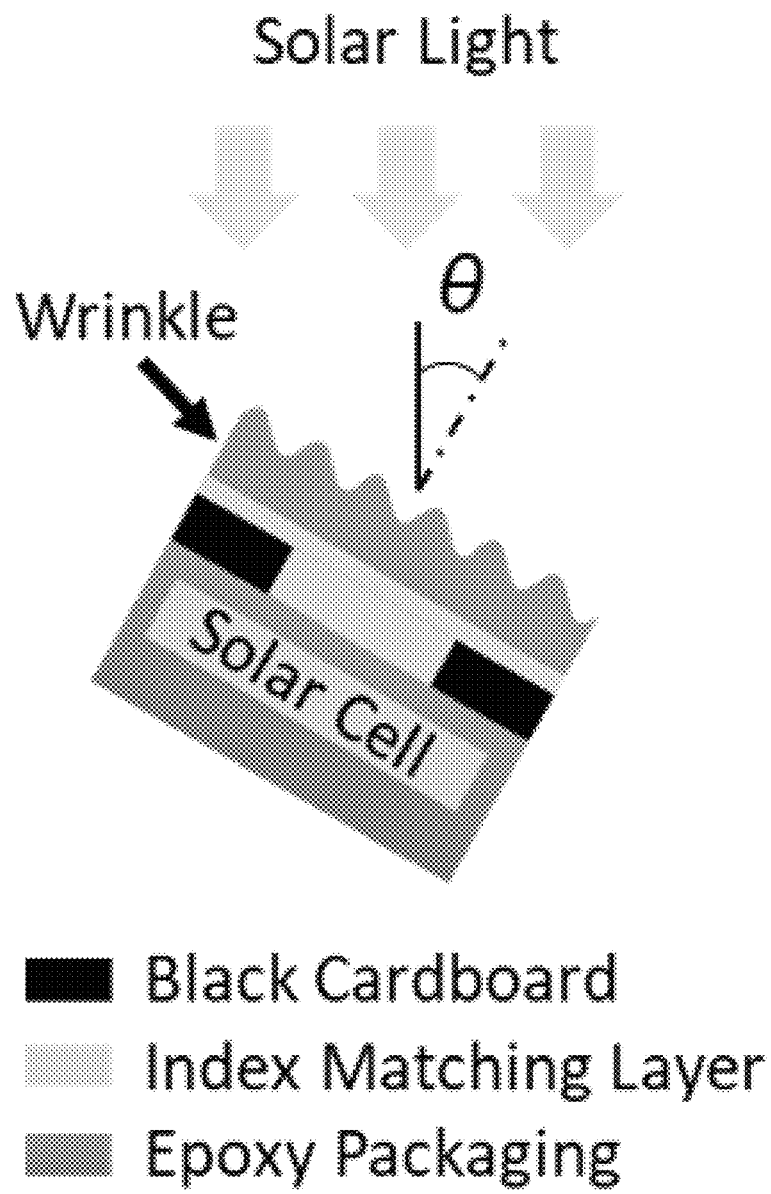
Figure 22D:
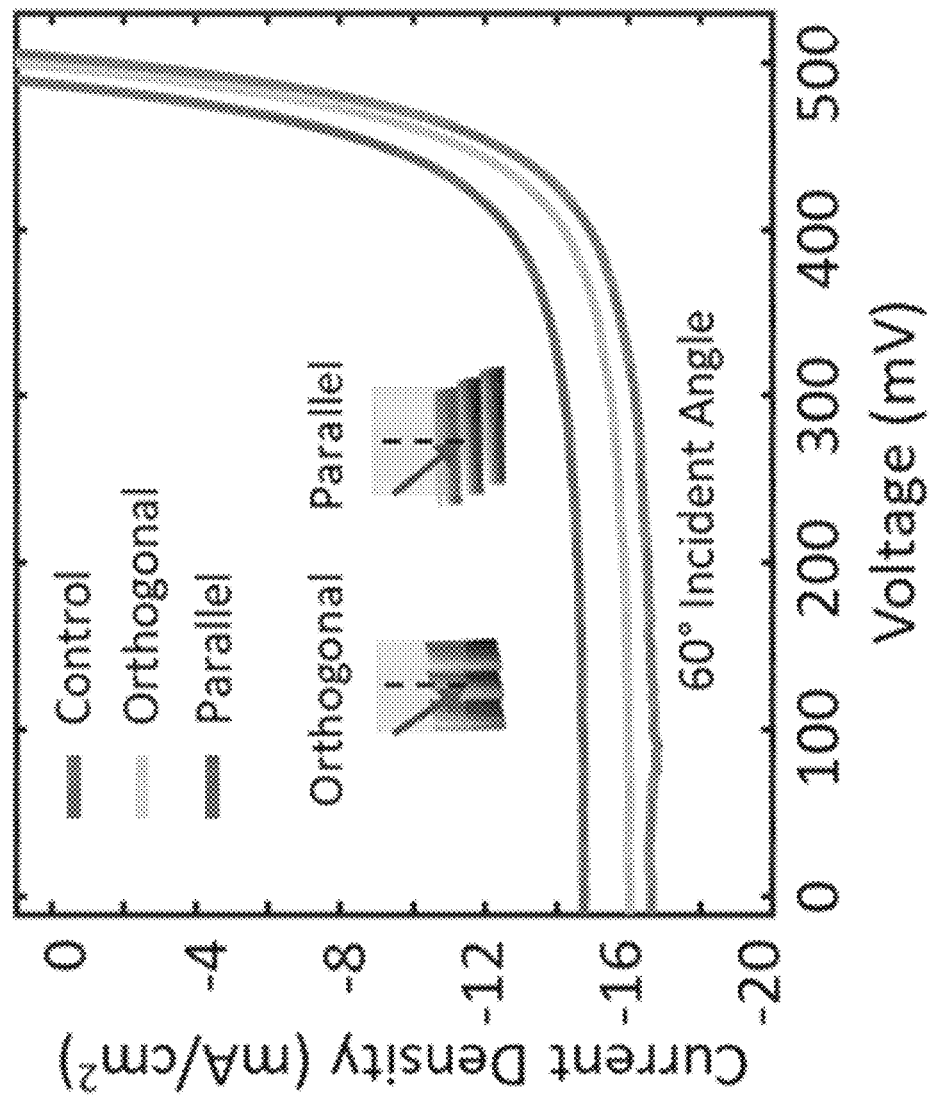

A comparison of I-V curves with and without the surface wrinkle diffusers at 60° incident angle is provided in FIG. 22D. The wrinkle-capped solar cell shows higher current density than that without the wrinkles. Illumination is also performed in the 'orthogonal' and 'parallel' directions to wrinkle patterns, as defined in the insets of FIG. 22D. The two IV curves show small differences, possibly due to the difference in scattering patterns. (In FIG. 22D, the upper line at mV=0) corresponds to the control: the middle line at mV=0 corresponds to the orthogonal, and the lower line at mV=0 corresponds to the parallel.)

Figure 22E:
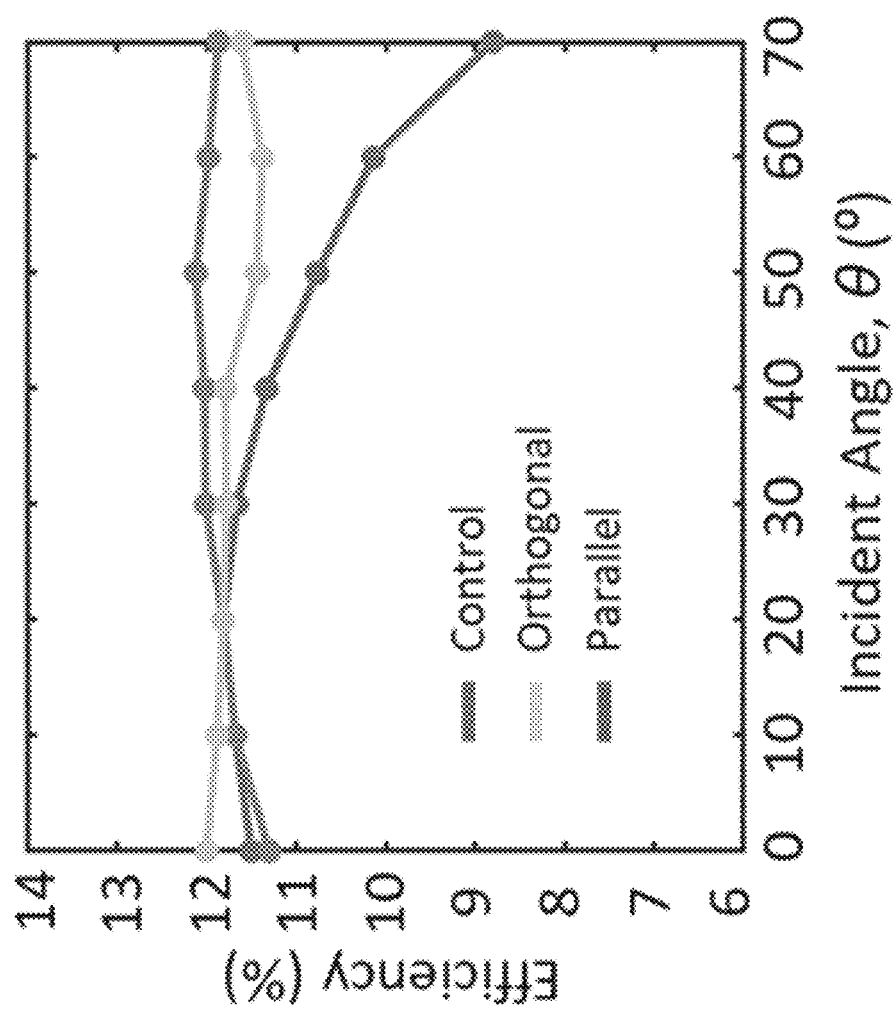

The impact of surface wrinkles on the power conversion efficiency under varying illumination angles is summarized in FIG. 22E. As shown, for a solar cell with texture-free smooth surface, the efficiency drops significantly with increasing incident angle, due to the increased reflection loss from Fresnel reflection.

With wrinkles on top of the solar cell, the transmitted light is scattered to enhance light absorption. As a result, the solar cell efficiency does not change significantly with increasing incident angle. At 70° incident angle, for example, the efficiency remains at ~12% in comparison to ~9% without the optical diffuser. (In FIG. 22E, at 70 degrees incident angle, the lower line corresponds to the control, the middle line corresponds to the orthogonal, and the upper line corresponds to the parallel.)

Figure 25A:
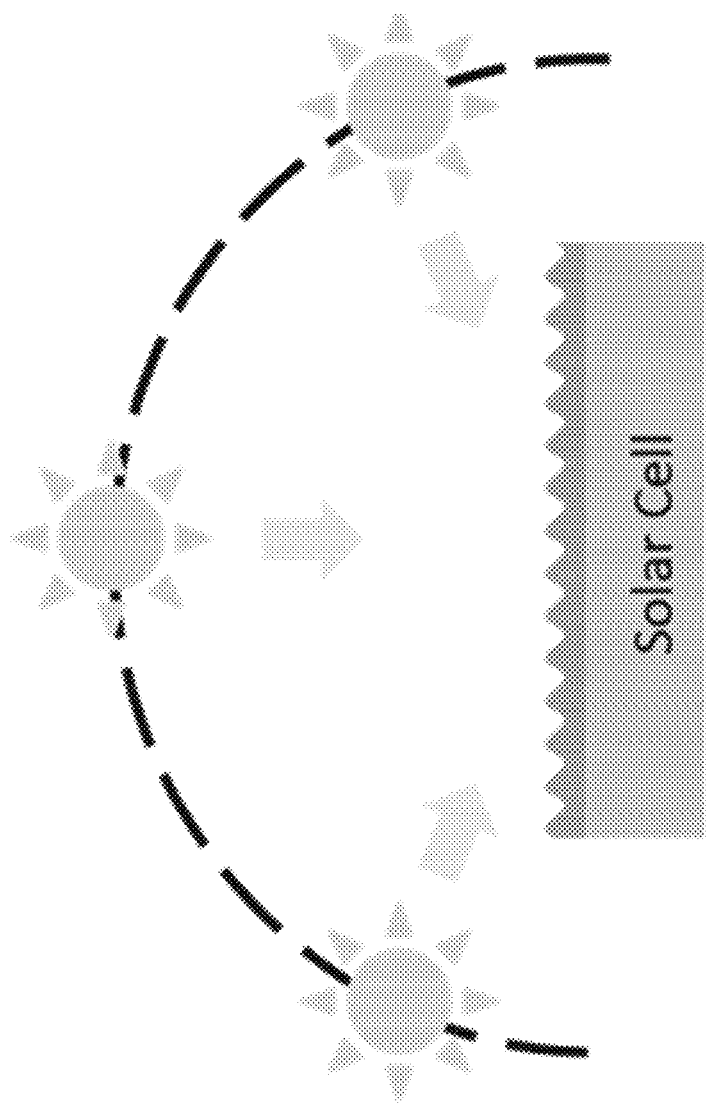
FIGS. 25A-25B provide an illustration of a solar cell made using materials according to the present disclosure.
Figure 25B:
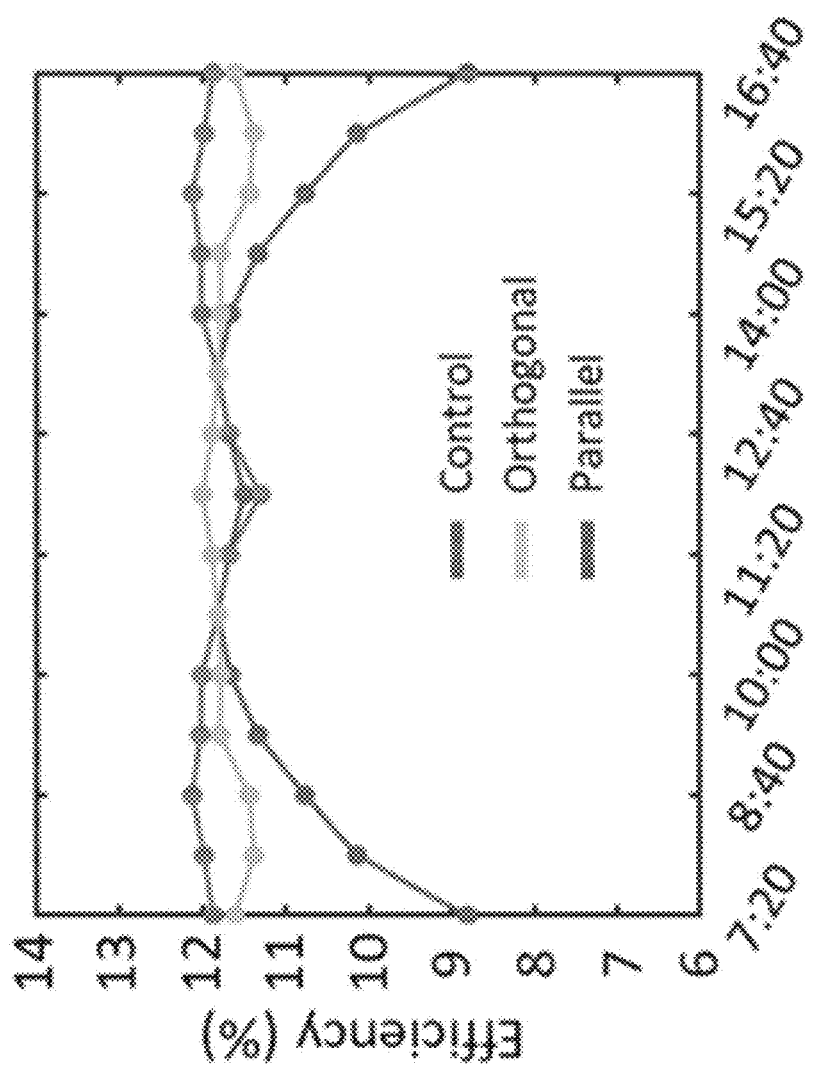

In FIG. 25A, a simplified sun movement model relates the incident angle to time of day. The enhancements of integrated solar efficiency for 'orthogonal' and 'parallel' configurations compared to bare (control) cells are 5.6% and 7.3%, respectively, as shown in FIG. 25B (at 16:40, the control data is the lowest line, orthogonal is the middle line, and parallel is the upper line). By adding a layer of wrinkled films to solar cells as the optical diffuser, one can maintain solar cell efficiency under varying solar illumination angles, and the scalable manufacturing technology described in this work can be used in optical diffusers that are retrofitted onto existing solar panels.

In conclusion, a scalable manufacturing technique to fabricate surface wrinkles over a large area is provided, with strain engineering achieved by surface curvatures. The bending of soft bilayer films over a cylindrical support provides the pre-strain to generate surface wrinkles. Illumination (e.g., $UV/O_3$ light) can be used to cure the top layer, which can be performed in ambient conditions. The interplay between bending and swelling strains can induce line and checkerboard-shaped surface wrinkles. Such a wrinkling process is demonstrated in a R2R system, and the utility of large-area winkles produced by this method is demonstrated by using the wrinkle as an optical diffuser to enhance light harvesting property of a solar panel under oblique solar illumination.

It should be understood that additional features can be added. For example, tension rollers can be added to the current design for quality control. Blade coatings can be used for continuous deposition of the top layer. Also, the disclosed methods can be extended to other pairs of UV-curable polymers and substrate materials. Polymer coatings with faster curing chemistry can increase production rate. With the manufacturing scalability, this technology can be used in various applications in biomedical, electronics, and optical devices as add-on layers to enhance their performance and efficiency.

Experimental Section

Roll-to-Roll (R2R) system: An exemplary R2R system was made using a $UV/O_3$ light source (COOSPIDER UV TUVC36), a motor (BXS230A-200S Brushless DC Motor, Oriental Motor), two rollers (MiSUMi USA), and a cooling fan (ARCTIC F8 PWM Cooling Fan). Additional parts, such as shafts, bearings, aluminum frames, base plate, and button controllers, were purchased from multiple vendors (Amazon.com, Thorlabs, Inc., MiSUMi USA). Fixtures of the parts and cylindrical rollers with different sizes were printed using 3D printers.

Wrinkling Experiments: PDMS (Sylgard 184, DOW Chemical Company) was mixed in 5:1 weight ratio of the base and curing agent, and cured at 60° C. for 5 hours as the substrate. UV-curable PDMS (KER 4690, Shin-Etsu Chemical Co., Ltd.) was mixed in 1:1 weight ratio of components A and B, and spin-coated onto the PDMS substrate at 4000 rpm for 1 minute. The coated sample was then manually laid on the curved surface of a cylindrical roller to induce pre-strain. Both ends were fixed with tapes. The roller was then installed on the R2R machine at a 5 mm distance from the light source.

For the sample shown in non-limiting FIG. 19B, a large piece of wrinkle sample was manufactured by rotating the rollers to achieve continuous exposure. After spin-coating the UV-curable PDMS on the 4 cm×4 cm PDMS substrate, the sample was installed on the two-roller machine with polyethylene terephthalate (PET) sheets taped to form a closed loop around the two rollers. The exposure distance was kept at 5 mm using an 8 mm diameter roller, and the roller speed was set at 0.02 rpm for complete exposure.

For samples in FIG. 20, stationary exposure of 15 min was used without rotation of the roller. Surface wrinkles were characterized using optical microscope (Carl Zeiss Microscope) and atomic force microscope (Bruker ICON AFM) in tapping mode to determine wavelength and height.

Finite Element Analysis: The FEA simulations are performed using 2D plane strain models in ABAQUS (Standard 6.9). Element type of CPE8RH is used and the PDMS is modeled as a neo-Hookean hyperelastic solid with $C10=1.1525$ MPa and $D1=7.805\times10-3$ $MPa^{-1}$.

The initial geometries are rectangles (w×l) with size determined from the thickness of PDMS, t, and roller diameters, d. The width is set as w=t and changes from 1 to 4 mm, and the length is $l=\pi d/2$, with d varying from 8 to 30 mm. A symmetric boundary condition is applied at one end. At the end, constraint of all degree of freedom is imposed to a reference point and then a rotation of $\pi$ and lateral movement of d are applied.

Optical Characterizations and Solar Cell Measurements: For optical properties, wrinkle films were characterized using a UV-vis-NIR spectrophotometer (Perkin-Elmer Lambda-750) with an integrating sphere. Solar cell IV curves were obtained from a solar simulator (Oriel Xenon Solar Simulator, AM1.5 Global Spectra). A single crystalline Si solar cell was used in the measurements. A thin black cardboard with 0.5×0.5 cm$^2$ aperture was used to limit the illumination area on the solar cell. To prevent air bubbles between the wrinkle film and the solar cell, glycerin liquid was used as an index matching layer since it has similar refractive index to PDMS. The whole stack was mounted on a rotational stage to change incident angles.

FIGURES

Reference is made below to certain of the attached figures. The figures are illustrative only and do not serve to limit the scope of the present disclosure or of the appended claims FIG. 1 provides a depiction of an exemplary system 10. As shown, elastomer sheet 108 is contacted to a substrate (cylindrical roller 106), which contact gives rise to a stress within elastomer sheet 108. A material coater 104 applies a second material 100, which material can be characterized in some embodiments as a hard skin material. The stress in the elastomer sheet 108 is released, thus giving rise to wrinkles 102 in the second material 100. The stress can be a tension. The stress can be modulated by way of the speed at which the substrate is moving, by way of a tension in the elastomer sheet, or in other ways known to those of skill in the art.

FIG. 2 provides a description of an exemplary system 20. As shown, elastomer sheet 200 is contacted to a substrate (cylindrical roller 202), which contact gives rise to a stress within the elastomer sheet 202. A stimulus 204 (e.g., a plasma, an illumination, one or more reactants) is applied to the elastomer sheet 200, which stimulus changes a mechanical property (e.g., to harden) of at least a portion of the uppermost portion of the elastomer sheet 200 at location 206. Following the stimulus treatment and release of the stress within the elastomer sheet 202, a region of wrinkles 208 is formed in elastomer sheet 200.

FIG. 8 provides an exemplary system 80. As shown, elastomer sheet 800 is contacted to substrate (e.g., a roller) 802, which in turn gives rise to a stress within elastomer sheet 800. A coater 204 can be used to apply a second material 806 (e.g., a UV-curable polymer) onto elastomer sheet 800. A stimulus (e.g., UV radiation, one or more reactants) is applied to the second material 806 so as to change a mechanical property (e.g., to harden) of at least a portion of the uppermost portion of the second material 806. Following the stimulus application, a region of wrinkles 812 is formed in the uppermost portion of the second material 806 applied to the elastomer sheet 800.

Figure 11:
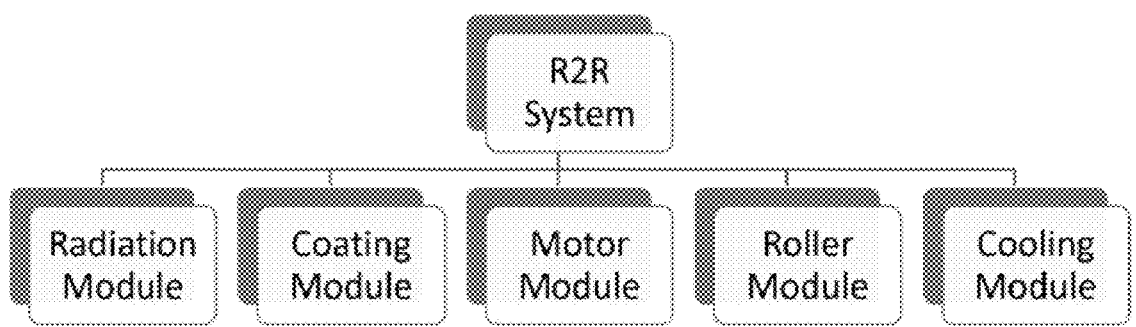
FIG. 11 provides a breakdown of the various modules that can be present in a roll-to-roll (R2R) system according to the present disclosure.

FIG. 11 provides a listing of modules than can be present in a system according to the present disclosure. A system can include five modules (or stages), that is, a radiation module, coating module, motor module, roller assembly and cooling module.

FIGS. 12-18 provide an illustrative, non-limiting system according to the present disclosure.

Figure 12:
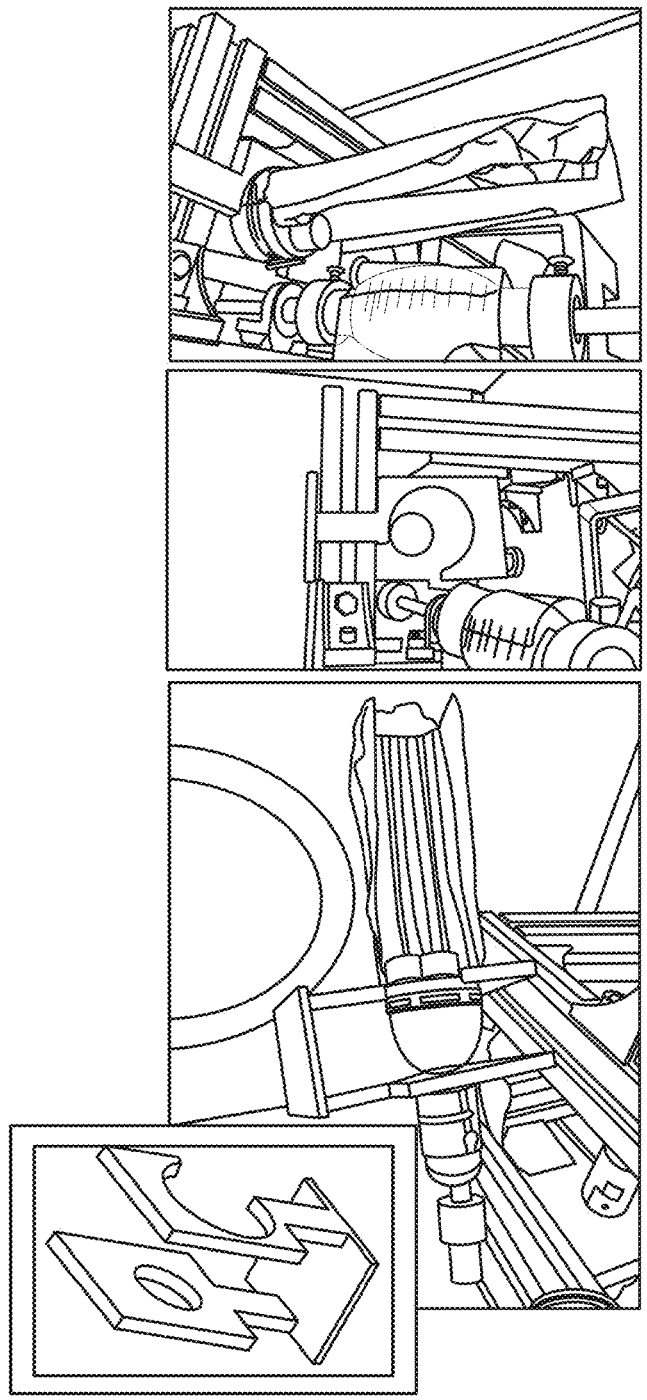
FIG. 12 provides an illustration of a mounted radiation source (in this case, a source of UV radiation) in a system according to the present disclosure.

FIG. 12 provides (left-most panel) an image of a bracket configured to hold a radiation source, e.g., one or more UV emitters. A radiation module can be a UV light source that emits in UVC (100-280 nm) band. Without being bound to any particular theory, it was found that 185 nm photons can harden the UV-PDMS layer, which plays a part in the wrinkle generation.

As shown (second from left panel), the emitter can be fitted into the bracket. The emitter can be shielded: shielding can be foil or other materials that are effective shields. In the second from right panel, the bracket is shown mounted on a mounting rail. With such an arrangement (or other arrangements), the user can adjust the distance between the emitter and the working material so as to modulate the intensity, duration, and/or dose of the exposure of the working material to radiation from the emitter. As shown in the right panel of FIG. 12, the emitter is suitably placed into optical communication with a support substrate (also termed a roller, in some embodiments), which support substrate acts to support the working material during the working material's exposure to radiation. The bracket and mounting shown in FIG. 12 is non-limiting, as other brackets and arrangements can be used. As one example, the movement of the radiation emitter (also termed a stimulus source, in some embodiments) can be effected manually or in an automated fashion.

Figure 13:
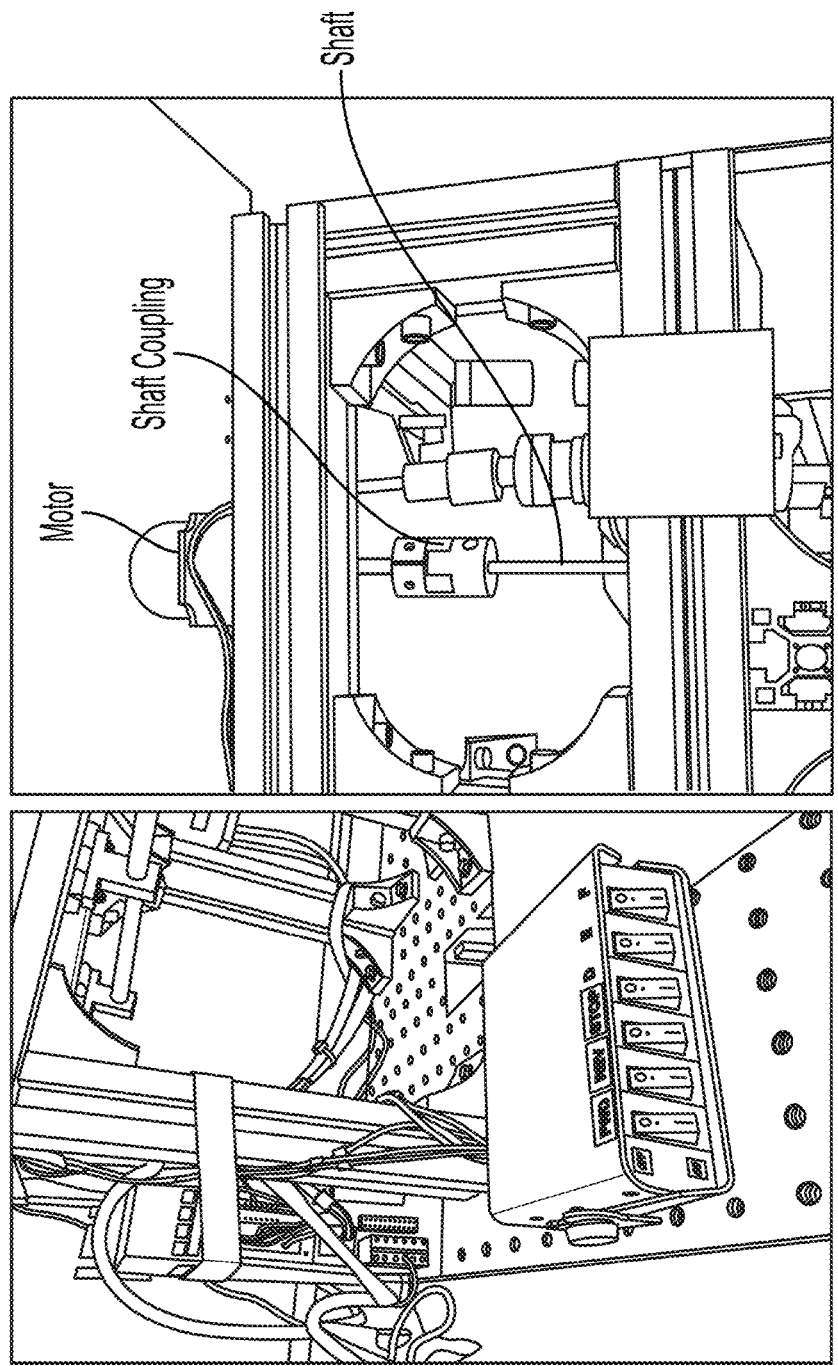
FIG. 13 provides an illustration of a motor and shaft with controller in a system according to the present disclosure.

FIG. 13 provides an illustration of (left panel) a controller used to modulate the operation of a motor or other devices used to move (e.g., revolve) the support substrate (e.g., roller) of a system according to the present disclosure. As shown, a controller can include forward, reverse, and stop controls, as well as controls that act to modulate the movement (e.g., revolutions per minute, torque) of the support substrate. The right panel of the figure shows a cutaway view of a motor configured to drive a shaft coupling and, in turn, a shaft that supports the support substrate. Control of the motor (or of any other aspect of the disclosed systems) can be effected manually, but can also be effected via laptop or other computing device. As shown in exemplary FIG. 13, a roller shaft is coupled by a shaft coupling with the motor shaft. The motor is digitally controlled by a controller shown in the left panel in the figure. A user interface using buttons is added, allowing for forward (FWD), reverse (REV), and emergency stop (STOP) functions.

Figure 14:
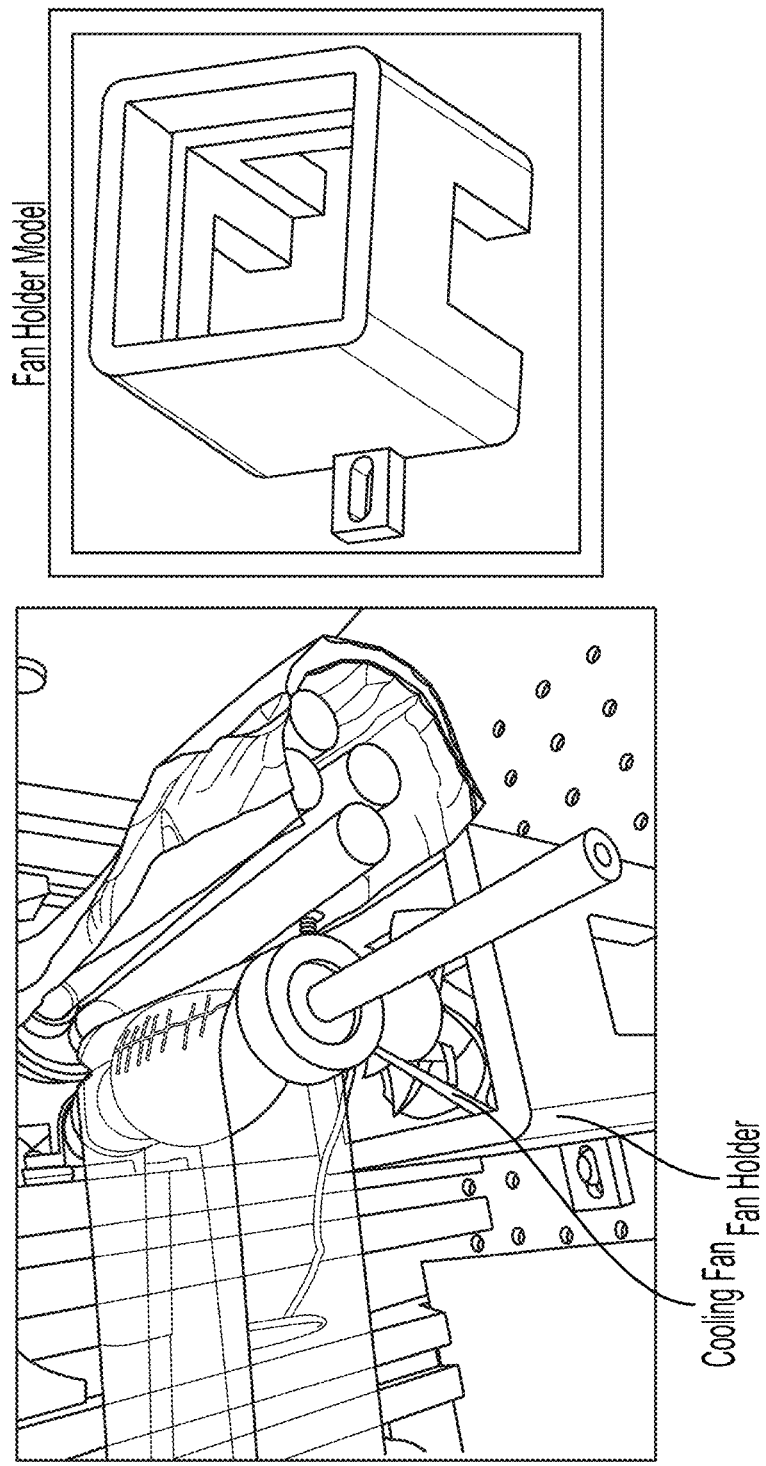
FIG. 14 provides an illustration of a cooling fan (and fan holder) in a system according to the present disclosure.

FIG. 14 provides an illustration (left panel) of a system according to the present disclosure that includes a cooling fan, which cooling fan can be mounted in a fan bracket. As shown, a cooling fan can be configured to effect cooling of a surface of a working material that is disposed on the support substrate (roller) and/or has been irradiated. Cooling can be effected by directing ambient air against the working material. Cooling can also be effected by directed cooled air (e.g., air that is at less than ambient temperature) against the working material. Cooling can also be effected by directing a fluid other than air (e.g., nitrogen, argon, or other gas) against the working material. A fan is not a requirement, as cooling can also be effected in a conductive manner (e.g., by placing the working material in a cooled cabinet or other enclosure). Cooling can also be effected by cooling the support substrate, e.g., via a refrigeration system, Peltier cooler, or other method. The right panel of FIG. 12 shows an exemplary fan holder.

In some embodiments, a system can be configured to heat the working material. This can be accomplished by, e.g., heating the support substrate, by heating the atmosphere surrounding the working material, blowing hot air or by other methods known in the art. Without being bound to any particular theory, heating (and/or cooling) the working material can be used to increase the throughput of a system.

Without being bound to any particular theory, cooling is useful to cool the polymers below glass transition point after UV curing. After cooling, the modulus difference between the top and the bottom layers is pronounced, which is a requirement to generate wrinkles. The cooling fan can be a regular CPU fan, and the fan speed is controllable using a potentiometer. A fan holder is designed and printed using 3D printing to hold the fan close to the exposure site.

Figure 15:
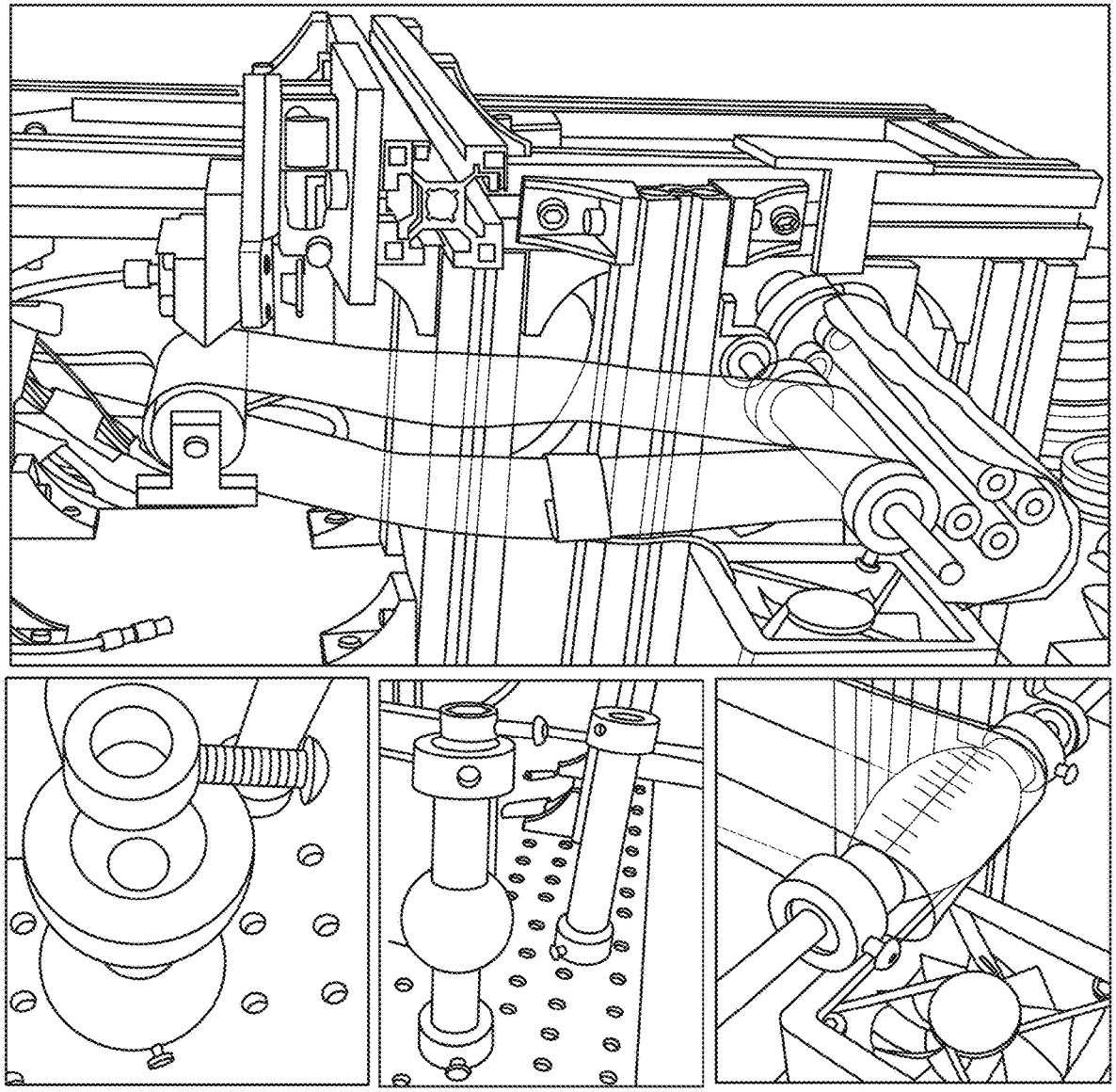
FIG. 15 provides an illustration of an exemplary system, including a driven roller, a free-rotating support roller, and various geometries for driven rollers.

FIG. 15 provides (top panel) a side view of an exemplary system according to the present disclosure. As shown, a support substrate (right side of image) is configured as a driven roller, with a free-spinning roller positioned at a distance from the driven roller, with a substrate (in belt form) looped across. The driven roller is in optical communication with a stimulus source, in this case a shielded source of UV radiation. The lower left panel of FIG. 15 provides a view of an exemplary support substrate. The lower middle panel of FIG. 15 provides two illustrative support substrates. The foreground support substrate includes a bulged portion at around the midpoint of the substrate: as described elsewhere herein, such bulges can be used to give rise to a strain field in a working material that is stretched over the support substrate. The background support substrate is of a cylindrical form. The lower right panel provides a further exemplary support substrate, which substrate has a football-type form.

As shown in exemplary FIG. 15, the roller on the left is a support roller with bearings. The roller can be coated (e.g., with polyurethane) for better friction with the belt. The roller on the right is a 3D-printed roller driven by the motor directly. 3D printing allows for the arbitrary design of the roller, thus enabling the manipulation of the stress field to induce different wrinkle types. Hybrid geometries can be integrated into one roller for heterogenous wrinkle morphologies in the same belt. In one example, the two roller designs in the forefront lower middle panel and the football shape in the lower right panel can be combined into one roller. In addition, more than two geometry types can be integrated in one roller. In some embodiments, the roll-to-roll system can have multiple rollers with functions such as material supply, tension adjustment, coating, and others. In some embodiments, rollers in series can be implemented to generate nested (hierarchical) wrinkles in multiple length scales.

Figure 16:
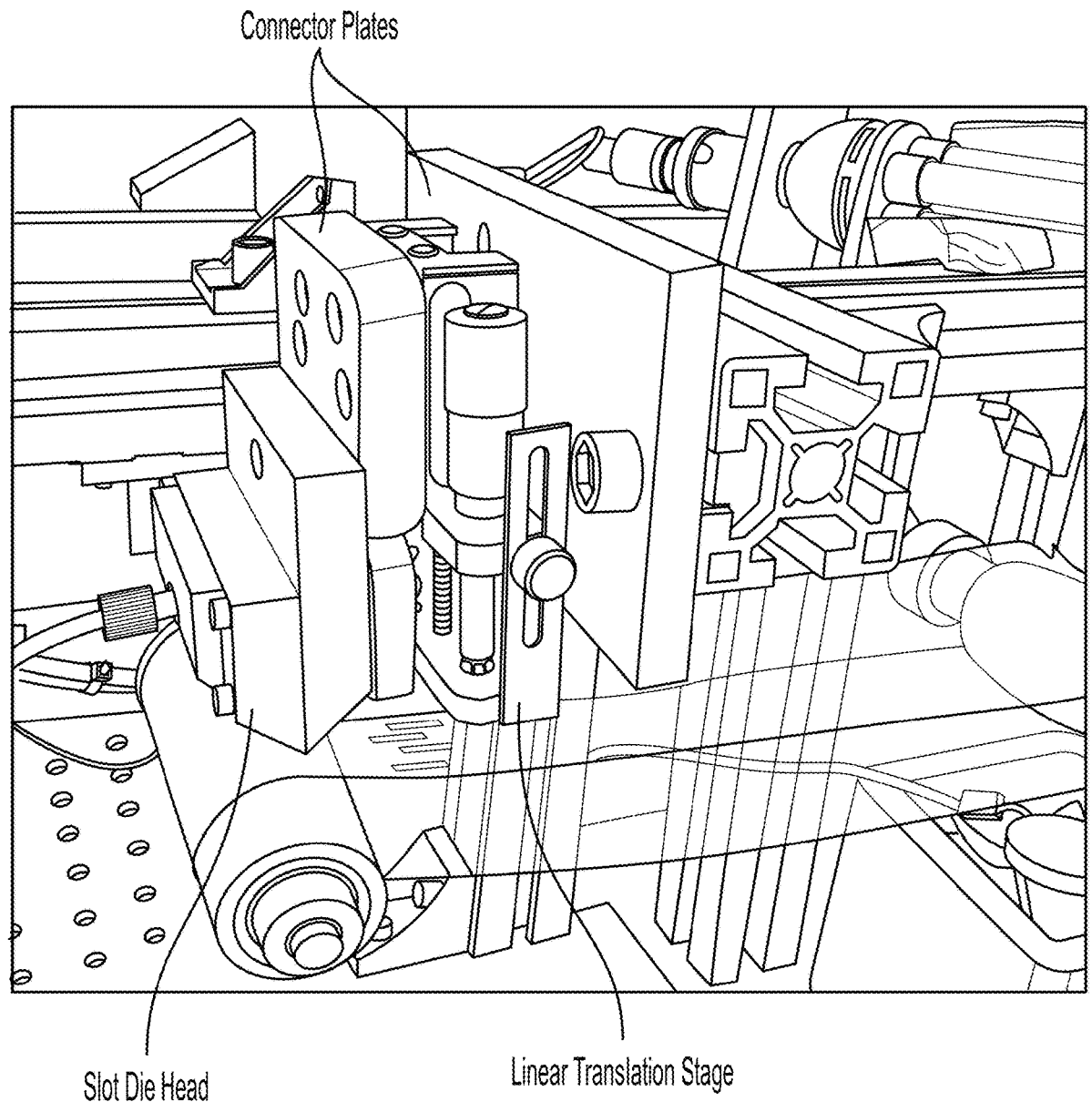
FIG. 16 provides an illustration of an exemplary slot die arrangement in a system according to the present disclosure.

FIG. 16 provides a depiction of a coating module of an exemplary system. (It should be understood that a coating module can deposit continuous coating layers, but can also be configured to deposit discrete amounts of material.) A moveable stage can be used to adjust the distance between the slot die and the substrate onto which material is dispensed from the slot die. The substrate can be moved relative to the slot die so as to adjust the distance between the die and the substrate either manually or digitally through feedback control systems.

As shown, a coating module can be configured to deposit one or more layers of a material atop a substrate as patterned or continuous coatings, e.g., one or more layers of a second polymer atop a ribbon or band of a first polymer. The coating module shown in FIG. 16 operates by way of slot die coating, but other coating methods can be used, e.g., doctor blade coating, gravure printing, dip coating, Langmuir-Blodgett coating, spray coating, spincoating, screen printing, inkjet printing, wire-wound rod coating, flexographic printing, sputtering, thermal evaporation, ion beam deposition, electron beam evaporation, chemical vapor deposition, atomic layer deposition, and the like, or any combination thereof.

Figure 17:
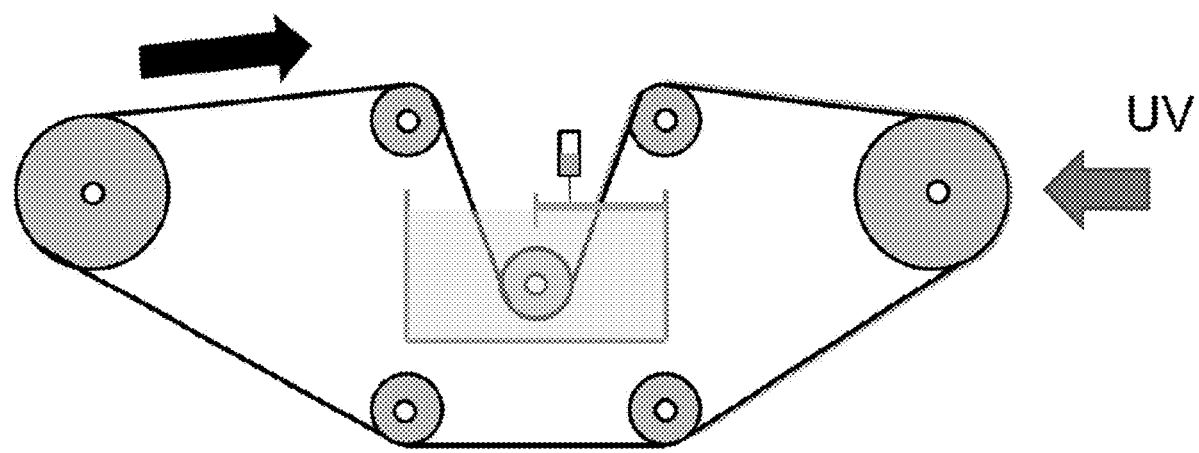
FIG. 17 provides a depiction of an exemplary Langmuir-Blodgett coating arrangement according to the present disclosure.

FIG. 17 provides an exemplary depiction of a Langmuir-Blodgett type coating system: such systems are known in the field. The material coated onto the substrate can be a polymer, but can also be other materials, e.g., nanoparticles, graphene, nanotubes (carbon and otherwise). In this way, a user can deposit a material or materials atop a working material on a substrate, and then further process the substrate according to the present disclosure so as to give rise to a desired wrinkling pattern in the working material. It should also be understood that materials can be applied before, during, or even after a working material has experienced a strain field.

As shown in FIG. 17, one can use a Langmiur-Blodgett (LB) trough. The LB trough relies on the air-liquid interface to assemble or flatten the coating materials. The coating material can be, without limitation, oils, polymers, graphene, graphene oxides, micro/nanoparticles, quantum dots, nanowires, 2D materials, nanotubes and the like, or any combinations of these materials. Coatings need not be applied only via the LB trough method, as coatings can be applied by other methods known in the art.

Figure 18:
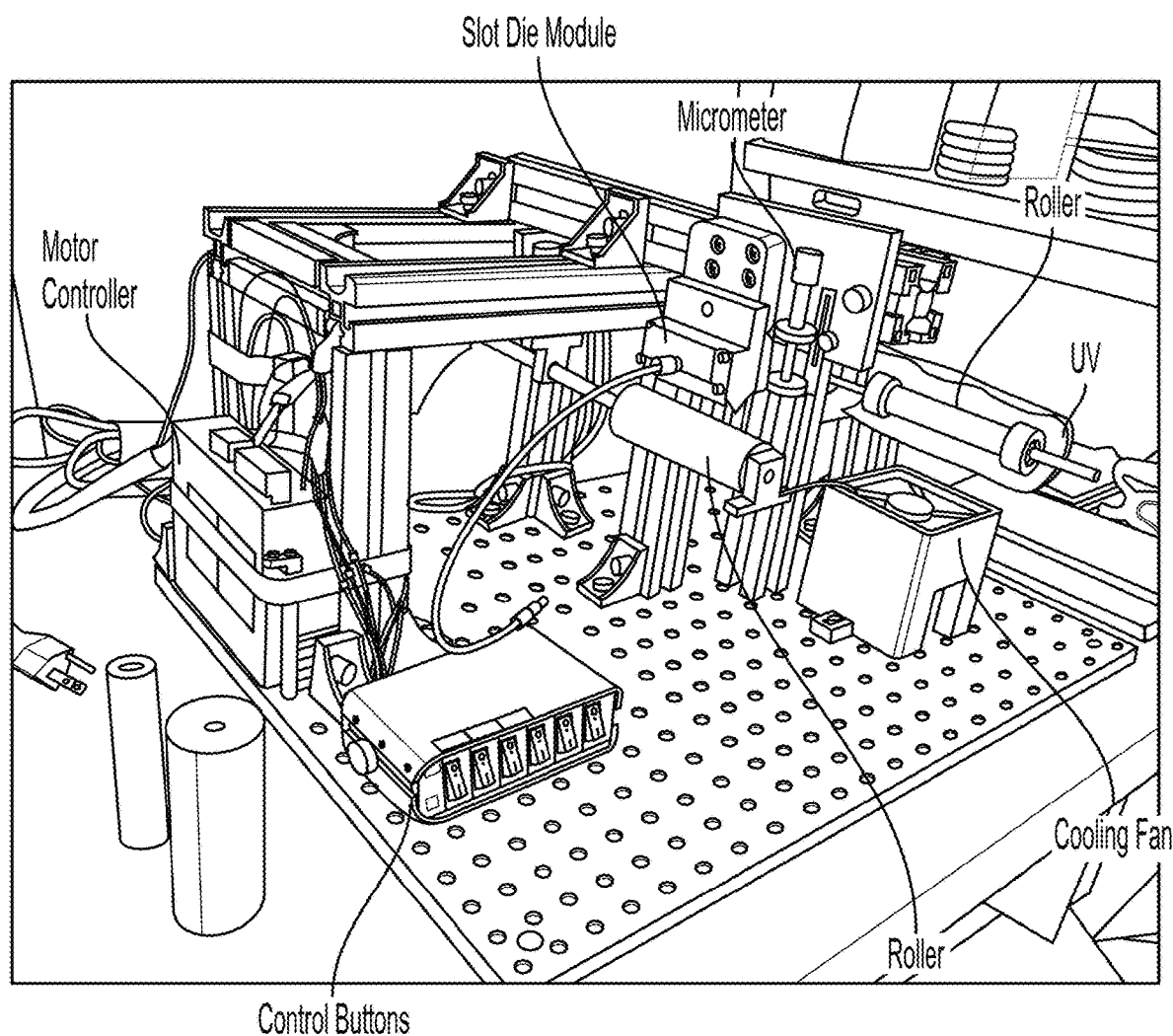
FIG. 18 provides an illustration of a system according to the present disclosure.

FIG. 18 provides a view of an exemplary system according to the present disclosure, showing the various components of the system assembled together.

FIGS. 19A-19B provide views of an exemplary system and related mechanisms of wrinkling. FIG. 19A provides a schematic illustration of a curvature-induced surface wrinkle manufacturing prototype. As shown, a curable material (e.g., a UV-curable polymer) can be disposed on a substrate, such as an elastomer substrate. The substrate can be present in a web form, e.g., a band of material. The assemblage of the curable material and elastomer is then advanced over/by the roller while the curable material is cured, which advancement effects a stress on the assemblage that, when released, results in the formation of persistent wrinkles in the now-cured curable material. This is shown in the lower panel of FIG. 19A, which provides an exemplary mechanism of wrinkling. As shown, a liquid UV-curable polymer can be coated on a soft elastomer sheet and is cured by UV light on the curve surface.

FIG. 19B provides (top panel) a photo of an exemplary 4×4 cm$^2$ surface wrinkle sample fabricated from the roll-to-roll prototype. FIG. 19B (middle panel) provides an atomic force microscope (AFM) image of the 1D sinusoidal wrinkle surface of the sample. The line plot (FIG. 19B, lower panel) shows the cross section of the wrinkle profile.

FIG. 20 provides a wrinkle library from processing with varying cylindrical roller diameter and PDMS substrate thickness. The optical microscope images show three distinct types of wrinkles in red (A), green (B), and orange (C) boxes.

Figure 21C:
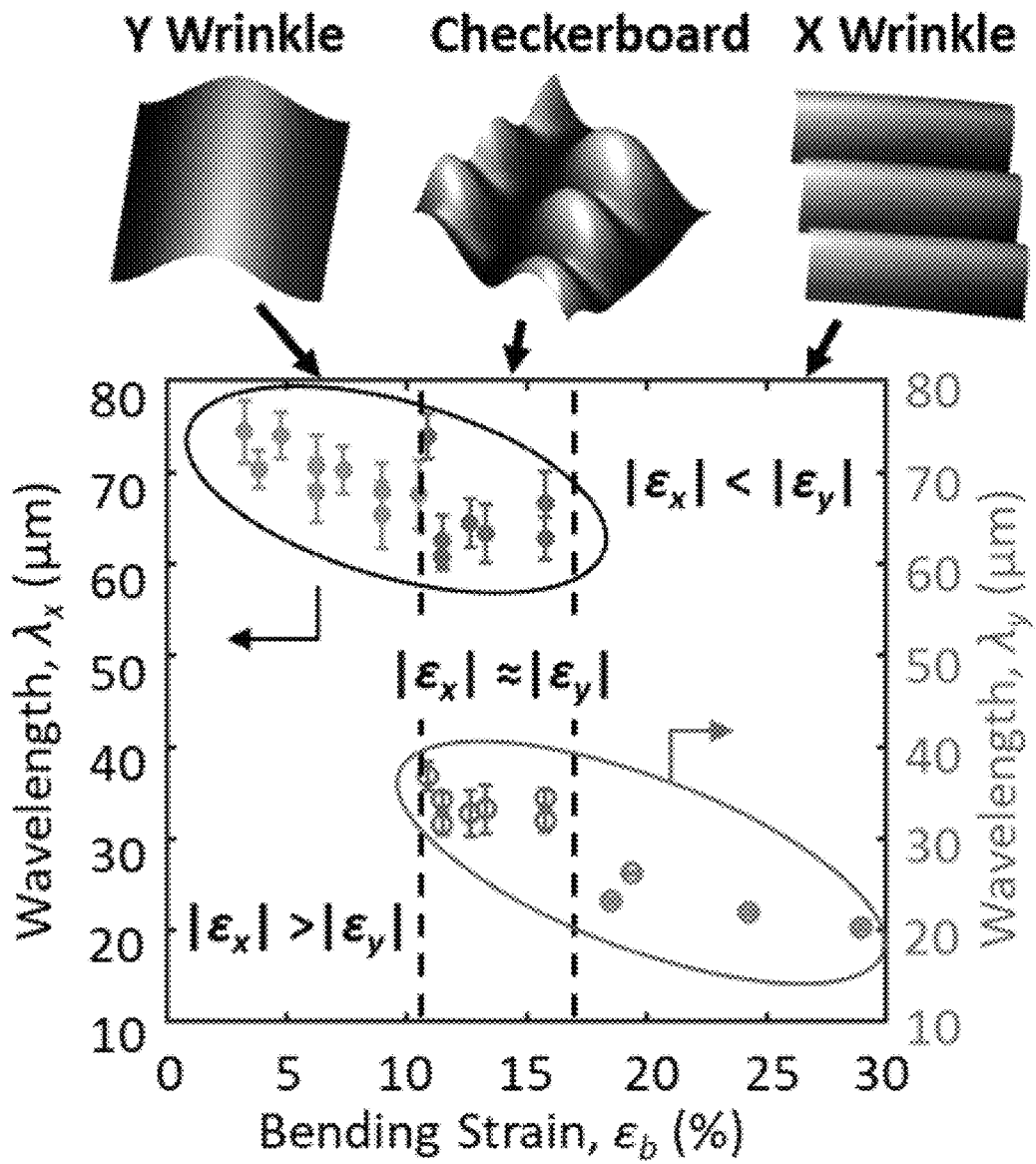

FIGS. 21A-21C provide further detail on the wrinkling mechanism. FIG. 21A provides UV exposure schematic for wrinkle generation from stationary roller. As shown, the left panel shows the bending strain distribution of the PDMS substrate using finite element analysis. Due to oxidation from UV/O$_3$ light source, a comparatively hard oxide layer exists on the UV-PDMS layer, as shown in the right panel diagram after unwrapping. $\lambda_y$ is wrinkle wavelength and H is wrinkle height. FIG. 21B provides an exemplary a strain diagram, showing bending and swelling strain states.

FIG. 21C provides wrinkle wavelength in x and y directions ($\lambda_x$ and $\lambda_y$) with respect to the respective bending strains. As shown, three distinct wrinkle types are found in three bending strain levels. The atomic force microscope (AFM) images show exemplary profiles for Y wrinkles, checkerboard wrinkles and X wrinkles.

FIGS. 22A-22E provide optical properties of surface wrinkles and solar energy harvesting using surface wrinkles as optical diffusers. FIG. 22A provides total transmission, diffuse transmission and total reflection for an exemplary wrinkle film (28.0 µm wavelength and 4.6 µm height)

measured using a UV-vis-NIR spectrophotometer equipped with an integrating sphere in the normal incidence.

FIG. 22B provides a photograph of the diffraction pattern from a 1D wrinkle film illuminated by a 532 nm laser pointer. FIG. 22C depicts a solar cell testing setup using solar simulator, in which θ is the incident angle of the solar light. FIG. 22D provides IV curves for solar cell with and without wrinkle film at 60° incident angle. 'Orthogonal' and 'parallel' refer to two illumination configurations for 1D wrinkle film. FIG. 22E provides solar cell efficiency at different incident angles with and without wrinkle films at orthogonal and parallel illumination configurations.

FIG. 23A provides a scanning electron microscope (SEM) image of the UV/$O_3$ light-cured UV-PDMS on Si substrate. A thin oxide layer can be observed on top of UV-PDMS, due to ozone oxidation. FIG. 23B provides an SEM image of a wrinkle sample of UV-PDMS on PDMS substrate, showing the existence of the top oxide layer.

FIG. 24 provides surface wrinkle aspect ratio (AR), defined as wrinkle height-to-wavelength ratio, with respect to bending strain from the same samples in FIG. 21C.

FIG. 25A provides a schematic illustration of the varied incident angles as sunlight moves during the day. FIG. 25B provides exemplary solar cell efficiency during day time according to the simplified sun movement model shown in FIG. 25A, where zero incidence occurs at noon and sun travels at a speed of 15° per hour. With wrinkles, the integrated efficiency enhancements are 5.6% and 7.3% for 'orthogonal' and 'parallel' configurations, respectively, compared to control solar cell with smooth surfaces.

Exemplary Aspects

The following aspects are illustrative only and do not serve to limit the present disclosure or the appended claims.

Aspect 1: A method, comprising: (a) with a working material that comprises an elastomeric material and a second material that defines the uppermost portion of the working material, effecting a stress within the working material, the effecting being accomplished by contacting the elastomeric material to a support substrate, optionally applying a stimulus so as to change a mechanical property of the uppermost portion of the working material, and at least partially releasing the stress within the working material so as to give rise to a plurality of persistent wrinkles in the uppermost portion of the working material: (b) applying a stimulus so as to change a mechanical property of an uppermost portion of a working material that comprises an elastomeric material, effecting a stress within the working material, the effecting being accomplished by contacting the elastomeric material to a support substrate, and at least partially releasing the stress within the intermediate material so as to give rise to a plurality of persistent wrinkles in the uppermost portion of the working material: or (c) any combination of (a) or (b).

Without being bound to any particular theory, a working material can be heated (e.g., via application of UV radiation) to a temperature above the glass transition temperature of the working material, and stress can be applied so as to give rise to the wrinkles. The stress can be relieved, and the working material can be cooled (e.g., via a fan or by other methods known to those of ordinary skill in the art) to a temperature below its glass transition temperature.

The second material suitably contacts the elastomeric material: the second material can be bonded, adhered, or otherwise attached to the elastomeric material. The second material can be removable from the elastomeric substrate, e.g., via peeling, via chemical methods or by other techniques known to those of ordinary skill in the art. As an example, the second material can be at least partially removable from the elastomeric material.

Aspect 2. The method of Aspect 1, further comprising depositing the second material atop the elastomeric material so as to give rise to the working material. The second material can be deposited by, e.g., electron beam evaporation, sputtering, chemical vapor deposition, ion beam deposition, spray coating, or any combination thereof.

Aspect 3. The method of any one of Aspects 1-2, wherein the support substrate is in motion. As one example, the support substrate can rotate. A support substrate can also act to stretch in another way, e.g., the support substrate can be one or more clamps that engage with the elastomeric material and then stretch the elastomeric material, e.g., via two clamps moving in opposite directions from one another.

As another example, a portion of the elastomeric material can be clamped or otherwise secured and then elastomeric material is stretched, e.g., via a single clamp moving away from another clamp. Elastomeric material can also be stretched by, e.g., a bar or roller contacting the elastomeric material and then being advanced so as to stretch the elastomeric material.

Aspect 4. The method of any one of Aspects 1-2, wherein the support substrate is stationary.

Aspect 5. The method of any one of Aspects 1-4, wherein the support substrate is characterized as cylindrical, spherical, toroidal, spheroidal, polyhedral, or any combination thereof. A support substrate can be smooth, but can also include one or more surface features, e.g., ridges, bumps, depressions, protrusions, and the like. The surface features can be repeating or even periodic, but this is not a requirement. The support substrate can have a constant cross-sectional dimension along its length, but can also have a cross-sectional dimension that varies along the length of the support substrate.

Aspect 6. The method of any one of Aspects 1-5, wherein the support substrate has a characteristic cross-sectional dimension in the range of from about 5 mm to about 100 mm, e.g., from about 5 mm to about 100 mm, from about 10 to about 90 mm, from about 20 to about 80 mm, from about 30 to about 70 mm, from about 40 to about 60 mm, or even about 50 mm.

Aspect 7. The method of any one of Aspects 1-6, wherein the contacting is continuous. This can be present in a R2R process. The contacting need not be continuous, however, as the contacting can be performed in a batch manner.

Aspect 8. The method of Aspect 7, wherein the elastomeric material, the working material, or both, is present as a roll or sheet.

Aspect 9. The method of any one of Aspects 1-8, wherein the stimulus, if present, comprises a radiation, a molecular species, a chemical reaction, or any combination thereof.

Aspect 10. The method of Aspect 9, wherein the molecular species comprises an oxygen plasma.

Aspect 11. The method of Aspect 10, wherein the radiation comprises ultraviolet, visible light, infrared light radiation.

Aspect 12. The method of any one of Aspects 1-11, wherein the elastomeric material comprises polydimethyl siloxane (PDMS). It is not, of course, a requirement that the elastomeric material be PDMS. Other example elastomeric materials include, e.g., polyurethane, natural rubber, polyisoprene, crosslinked poly butadiene, thermoplastic elastomers, and the like. An elastomeric material can be one that has a glass transition temperature below room temperature (about 23 deg. C.).

Aspect 13. The method of any one of Aspects 1-12, wherein the second material is characterized as bonded to the elastomeric material.

Aspect 14. The method of any one of Aspects 1-13, wherein the second material has a Young's modulus that is greater than the Young's modulus of the elastomeric material Aspect 15. The method of any one of Aspects 1-14, wherein the plurality of persistent wrinkles has a wavelength of from about 100 nm to about 100 um. Exemplary, non-limiting wavelengths can be, e.g., from about 100 nm to about 100 um, from about 200 nm to about 75 um, from about 300 nm to about 50 um, from about 500 nm to about 25 um, from about 1 um to about 20 um, from about 5 um to about 10 um, and all intermediate values.

Aspect 16. The method of any one of Aspects 1-15, wherein the plurality of persistent wrinkles has an amplitude of from about 50 nm to about 20 um. Exemplary amplitudes can be, e.g., from about 50 nm to about 20 um, from about 75 nm to about 15 um, from about 100 nm to about 10 um, from about 200 nm to about 8 um, from about 300 nm to about 7 um, from about 500 nm to about 5 um, or even from about 1000 nm to about 2 um, and all intermediate values.

Aspect 17. The method of any one of Aspects 1-16, wherein the plurality of persistent wrinkles are characterized as parallel wrinkles, herringbone wrinkles, checkerboard wrinkles, or disordered wrinkles. Parallel wrinkles can be parallel to one another, and can run in either the x-direction or the y-direction. Checkerboard wrinkles can define individual peaks that are symmetric in the x- and y-directions, e.g., a peak that sits atop a square base. Checkerboard wrinkles can also define individual peaks that sit atop bases that are not symmetric in the x- and y-directions, e.g., a base that has a dimension in the x-direction that differs from the base's dimension in the y-direction. The ratio of the x-direction dimension to the y-direction dimension can be, e.g., from 100:1 to 1:100, from 50:1 to 1:50, from 25:1 to 1:25, from 10:1 to 1:10, from 5:1 to 1:5, or even from 2:1 to 1:2.

Aspect 18. A persistently wrinkled material produced according to any of Aspects 1-17. Such materials can be incorporated into, e.g., solar energy systems (including solar cells and solar collectors), a cell alignment system, a cell culturing system, a protein expression system, a medical implant, an antibacterial and anti-fouling surface, a filtration and/or desalination membrane system, a substrate for a flexible electronic device, a template for self-assembly (e.g., for applications in optical metasurfaces), in surface-enhanced spectroscopy, and in strain sensing and other sensors. Reversible wrinkle formation under cyclical stretching and release can also be used to dynamically manipulate light transmission, liquid wetting, and surface adhesion. In addition, surface wrinkling can also be used in metrology to determine the mechanical properties of thin films Aspect 19. An article, comprising: a sheet (the sheet optionally being flexible) having an uppermost portion, the uppermost portion comprising a plurality of wrinkles (the wrinkles optionally being persistent) having a wavelength of from about 100 nm to about 100 um and an amplitude of from 50 nm to about 20 um. The plurality of wrinkles can be crack-free, e.g., crack-free over an area. As an example, the article can include a plurality of wrinkles that are crack-free over an area of 1 mm×1 mm. Exemplary wrinkle patters and dimensions are provided elsewhere herein.

Aspect 20. The article of Aspect 19, wherein the article (1) comprises a second material that comprises the uppermost portion and (2) comprises an elastomeric material that supports the first layer, the second layer being bound (or adhered or otherwise attached) to the elastomeric material. It should be understood that an article can include multiple layers of the same or different materials. An article can also include materials that are present in layer form, but materials can also be present as dots, strips, islands, or other forms.

Without being bound to any particular theory, an article can include one or more base layers, atop which base layer or layers are deposited regions of one or more other materials. These regions can be deposited before, after, or even during the application of stress to a working material.

Aspect 21. The article of Aspect 20, wherein the first layer has a Young's modulus that is greater than the Young's modulus of the second layer.

Aspect 22. The article of any one of Aspects 20-21, wherein the first layer and second layer are bonded to one another.

Aspect 23. The article of any one of Aspects 19-22, wherein the article defines a thickness in the range of from about 0.1 to about 5 mm.

Aspect 24. A system, comprising: a (first) support substrate: the system being configured to contact a working material to the support substrate so as to give rise to a stress within the working material; and optionally, a stimulus source configured to apply a stimulus to an uppermost portion of the working material, and the system being configured to at least partially release the stress within the working material so as to give rise to a plurality of persistent wrinkles in the uppermost portion of the working material. As described and shown herein, such systems allow for roll-to-roll production of materials have persistent wrinkling patterns.

Aspect 25. The system of Aspect 24, wherein the support substrate is rotatable. Suitable support substrates are described elsewhere herein, and include, e.g., substrates that are cylindrical, spherical, toroidal, spheroidal, polyhedral, or any combination thereof. A support substrate can be smooth, but can also include one or more surface features, e.g., ridges, bumps, depressions, protrusions, and the like. The surface features can be repeating or even periodic, but this is not a requirement.

Aspect 26. The system of any one of Aspects 24-25, wherein the system is configured to contact the working material to the support substrate continuously.

Aspect 27. The system of any one of Aspects 24-26, wherein the stimulus source comprises a radiation source, an oxygen plasma source, or any combination thereof.

Aspect 28. The system of Aspect 27, wherein the stimulus source comprises a source of ultraviolet radiation.

Aspect 29. The system of any one of Aspects 24-28, further comprising a roll source of material capable of mechanical communication with the support substrate, the material optionally being an elastomeric material.

Aspect 30. The system of any one of Aspects 24-29, wherein the support substrate is characterized as cylindrical, spherical, toroidal, spheroidal, polyhedral, or any combination thereof.

Aspect 31. The system of Aspect 30, wherein the support substrate defines a non-constant cross-section along a length of the support substrate.

Aspect 32. The system of Aspect 31, wherein the support substrate defines a concave region, a convex region, or both. A support substrate with a football profile is suitable, as are support substrates with one or more bulges and patterned topographies to make patterns of wrinkles.

Aspect 33. The system of any one of Aspects 24-32, wherein the working material (1) comprises a second material that defines the uppermost portion of the working material and (2) comprises an elastomeric material that supports the second material layer. The second material can be deposited by, e.g., doctor blade coating, gravure printing, dip coating, Langmuir-Blodget coating, spray coating, spin coating, screen printing, inkjet printing, wire-wound rod coating, flexographic printing, sputtering, thermal evaporation, ion beam deposition, electron beam evaporation, chemical vapor deposition, atomic layer deposition, or any combination thereof.

Aspect 34. The system of any one of Aspects 24-33, further comprising a coater configured to deposit a second material onto an elastomeric material such that the second material comprises the uppermost portion of the working material.

Aspect 35. The system of any one of Aspects 24-34, further comprising a cooling module configured to effect cooling of the working material.

Aspect 36. The system of Aspect 35, wherein the cooling module comprises a fan configured to direct fluid flow against the working material. Other cooling modules can be used, e.g., chillers and the like.

Aspect 37. The system of Aspect 36, wherein the cooling module comprises a module configured to effect cooling of the support substrate.

Aspect 38. The system of any one of Aspects 24-33, further comprising a second support substrate. The second support substrate can have the same profile and/or surface features as the first support substrate, but this is not a requirement, as the first and second support substrates can differ in size, shape, or other features.

Aspect 39. The system of any one of Aspects 24-38, wherein the system defines an adjustable distance between the stimulus source and the support substrate.

Aspect 40. The system of Aspect 39, wherein one or both of the stimulus source and the support substrate are capable of motion relative to the other.

Aspect 41. The system of Aspect 34, wherein the coater is characterized as a dip coater, a doctor blade coater, a Langmuir-Blodgett coater, a gravure coater, spray coater, spincoater, screen printing head, inkjet printing head, wire-wound rod coater, flexographic printer, sputtering coater, thermal evaporation coater, ion beam deposition coater, electron beam evaporation coater, chemical vapor deposition coater, atomic layer deposition coater, or any combination thereof.

Aspect 42. The wrinkled article according to Aspect 18, wherein the persistently wrinkled article is incorporated into a solar energy system, an imaging system, a sensor system, a medical implant, a flexible electronic device, a desalination system, a filtration system, a template for molecular or cellular self-assembly, a surface-enhanced spectroscopy device, or any combination thereof.

Aspect 43. The persistently wrinkled article according to any one of Aspects 19-23, wherein the article is incorporated into a solar energy system, an imaging system, a sensor system, a medical implant, a flexible electronic device, a desalination system, a filtration system, a template for molecular or cellular self-assembly, a surface-enhanced spectroscopy device, or any combination thereof.

REFERENCES

Yang, Shu: Khare, Krishnacharya: Lin, Pei-Chun. Harnessing Surface Wrinkle Patterns in Soft Matter. Advanced Functional Materials 2010, 20 (16), 2550-2564.

Chen, Chi-Mon: Yang, Shu. Wrinkling Instabilities in Polymer Films and Their Applications. Polymer International 2012, 61 (7), 1041-1047.

Bowden, Ned: Brittain, Scott; Evans, Anthony G.; Hutchinson, John W.; Whitesides, George M. Spontaneous Formation of Ordered Structures in Thin Films of Metals Supported on an Elastomeric Polymer. Nature 1998, 393 (6681), 146-149.

Chung, Jun Young: Nolte, Adam J.; Stafford, Christopher M. Diffusion-Controlled, Self-Organized Growth of Symmetric Wrinkling Patterns. Advanced Materials 2009, 21 (13), 1358-1362.

Lin, Pei-Chun: Yang, Shu. Spontaneous Formation of One-Dimensional Ripples in Transit to Highly Ordered Two-Dimensional Herringbone Structures through Sequential and Unequal Biaxial Mechanical Stretching. Applied Physics Letters 2007, 90 (24), 241903.

Chandra, Dinesh: Crosby, Alfred J. Self-Wrinkling of UV-Cured Polymer Films. Advanced Materials 2011, 23 (30), 3441-3445.

J. Rodríguez-Hernández, Prog. Polym. Sci. 2015, 42, 1.

J. Genzer, J. Groenewold, Soft Matter 2006, 2, 310.

S. Yang, K. Khare, P.-C. Lin, Adv. Funct. Mater. 2010, 20, 2550.

C.-M. Chen, S. Yang, Polym. Int. 2012, 61, 1041.

Z. Wang, D. Tonderys, S. E. Leggett, E. K. Williams, M. T. Kiani, R. Spitz Steinberg, Y. Qiu, I. Y. Wong, R. H. Hurt, Carbon 2016, 97, 14.

S. Wang, A. Thomas, E. Lee, S. Yang, X. Cheng, Y. Liu, Analyst 2016, 141, 2228.

Q. Zhou, P. Wünnemann, P. T. Kuhn, J. de Vries, M. Helmin, A. Böker, T. G. van Kooten, P. van Rijn, Adv. Mater. Interfaces 2016, 3, 1600275.

K. Efimenko, J. Finlay, M. E. Callow, J. A. Callow, J. Genzer, ACS Appl Mater Interfaces 2009, 1, 1031.

H. Wu, S. Kustra, E. M. Gates, C. J. Bettinger, Org. Electron. 2013, 14, 1636.

D.-Y. Khang, J. A. Rogers, H. H. Lee, Adv. Funct. Mater. 2009, 19, 1526.

Y. Sun, W. M. Choi, H. Jiang, Y. Y. Huang, J. A. Rogers, Nat. Nanotechnol. 2006, 1, 201.

M. Mayer, M. Tebbe, C. Kuttner, M. J. Schnepf, T. A. F. König, A. Fery, Faraday Discuss. 2016, 191, 159.

N. Pazos-Pérez, W. Ni, A. Schweikart, R. A. Alvarez-Puebla, A. Fery, L. M. Liz-Marzán, Chem. Sci. 2010, 1, 174.

L. Minati, A. Chiappini, C. Armellini, A. Carpentiero, D. Maniglio, A. Vaccari, L. Zur, A. Lukowiak, M. Ferrari, G. Speranza, Mater. Chem. Phys. 2017, 192, 94.

Y. Yu, C. Ng, T. A. F. König, A. Fery, Langmuir 2019, DOI 10.1021/acs.langmuir.8b04279.

G. Lin, P. Chandrasekaran, C. Lv, Q. Zhang, Y. Tang, L. Han, J. Yin, ACS Appl. Mater. Interfaces 2017, 9, 26510.

D. Rhee, W.-K. Lee, T. W. Odom, Angew. Chem. Int. Ed. 2017, 56, 6523.

Y. Rahmawan, C.-M. Chen, S. Yang, Soft Matter 2014, 10, 5028.

J. Y. Chung, A. J. Nolte, C. M. Stafford, Adv. Mater. 2011, 23, 349.

C. M. Stafford, C. Harrison, K. L. Beers, A. Karim, E. J. Amis, M. R. VanLandingham, H.-C. Kim, W. Volksen, R. D. Miller, E. E. Simonyi, Nat. Mater. 2004, 3, 545.

P.-C. Lin, S. Yang, Appl. Phys. Lett. 2007, 90, 241903.

N. Bowden, S. Brittain, A. G. Evans, J. W. Hutchinson, G. M. Whitesides, Nature 1998, 393, 146.

H. S. Kim, A. J. Crosby, Adv. Mater. 2011, 23, 4188.

M. Guvendiren, S. Yang, J. A. Burdick, Adv. Funct. Mater. 2009, 19, 3038.

L. Qi, C. Ruck, G. Spychalski, B. King, B. Wu, Y. Zhao, ACS Appl. Mater. Interfaces 2018, 10, 4295.

D. Chandra. A. J. Crosby. Adv. Mater. 2011, 23, 3441.

J. Song. H. Jiang. W. M. Choi. D. Y. Khang. Y. Huang. J. A. Rogers. J. Appl. Phys. 2008, 103, 014303.

A. Lamoureux. K. Lee. M. Shlian. S. R. Forrest. M. Shtein. Nat. Commun. 2015, 6, 8092.

Y. Jiang. L. M. Korpas. J. R. Raney. Nat. Commun. 2019, 10, 128.

What is claimed:

1. A method, comprising:
   (a) with a working material that comprises an elastomeric material and a second material that defines the uppermost portion of the working material,
      effecting a stress within the working material, the effecting being accomplished by transiently contacting the elastomeric material to a continuously revolving, curved support substrate,
      at least partially releasing the stress within the working material so as to give rise to a plurality of persistent wrinkles in the uppermost portion of the working material, or
   (b) applying a stimulus so as to change a mechanical property of an uppermost portion of a working material that comprises an elastomeric material,
      effecting a stress within the working material, the effecting being accomplished by transiently contacting the elastomeric material to a continuously revolving, curved support substrate, and
      at least partially releasing the stress within the working material so as to give rise to a plurality of persistent wrinkles in the uppermost portion of the working material; or
   (c) any combination of (a) or (b).

2. The method of claim 1, further comprising depositing the second material atop the elastomeric material so as to give rise to the working material.

3. The method of claim 1, wherein the support substrate is characterized as cylindrical, spherical, toroidal, spheroidal, polyhedral, or any combination thereof.

4. The method of claim 1, wherein the stimulus, if present, comprises a radiation, a molecular species, a chemical reaction, or any combination thereof.

5. The method of claim 1, wherein (a) the second material is characterized as bonded to the elastomeric material, (b) the second material has a Young's modulus that is greater than the Young's modulus of the elastomeric material, or both (a) and (b).

6. The method of claim 1, wherein (a) the plurality of persistent wrinkles has a wavelength of from about 100 nm to about 100 um, (b) the plurality of persistent wrinkles has an amplitude of from about 50 nm to about 20 um, or both (a) and (b).

7. The method of claim 1, wherein the plurality of persistent wrinkles are characterized as parallel wrinkles, herringbone wrinkles, or disordered wrinkles.

8. The method of claim 1, further comprising applying a stimulus so as to change a mechanical property of the uppermost portion of the working material.

\* \* \* \* \*

UNITED STATES PATENT AND TRADEMARK OFFICE
CERTIFICATE OF CORRECTION

| | | |
|---|---|---|
| PATENT NO. | : 12,145,816 B2 | |
| APPLICATION NO. | : 17/053909 | |
| DATED | : November 19, 2024 | |
| INVENTOR(S) | : Daeyeon Lee et al. | |

It is certified that error appears in the above-identified patent and that said Letters Patent is hereby corrected as shown below:

In the Specification

Under Column no. 2, Line no. 5, Replace:
"wrinkles"
With:
--wrinkles'--

Under Column no. 2, Line no. 30, Replace:
"material:"
With:
--material;--

Under Column no. 2, Line no. 38, Replace:
"material:"
With:
--material;--

Under Column no. 2, Line no. 42, Replace:
"substrate:"
With:
--substrate;--

Under Column no. 4, Line no. 54, Replace:
"value:"
With:
--value;--

Under Column no. 5, Line no. 32, Replace:
"poly dimethylsiloxane"

Signed and Sealed this
Eleventh Day of February, 2025

Coke Morgan Stewart
*Acting Director of the United States Patent and Trademark Office*

With:
--polydimethylsiloxane--

Under Column no. 7, Line no. 63, Replace:
"quality:"
With:
--quality;--

Under Column no. 9, Line no. 67, Replace:
"23B:"
With:
--23B;--

Under Column no. 10, Line no. 33, Replace:
"exposure:"
With:
--exposure;--

Under Column no. 11, Line no. 29, Replace:
"control:"
With:
--control;--

Under Column no. 14, Line no. 2, Replace:
"shielded:"
With:
--shielded;--

Under Column no. 15, Line no. 16, Replace:
"substrate:"
With:
--substrate;--

Under Column no. 15, Line no. 64, Replace:
"system:"
With:
--system;--

Under Column no. 17, Line no. 46, Replace:
"material:"
With:
--material;--

Under Column no. 17, Line no. 54, Replace:
"material:"

CERTIFICATE OF CORRECTION (continued)
U.S. Pat. No. 12,145,816 B2

With:
--material;--

Under Column no. 17, Line no. 64, Replace:
"material:"
With:
--material;--

Under Column no. 18, Line no. 64, Replace:
"poly butadiene,"
With:
--polybutadiene,--

Under Column no. 19, Line nos. 6-7, Replace:
"material"
With:
--material.--

Under Column no. 20, Line nos. 20-21, Replace:
"substrate:"
With:
--substrate;--

Under Column no. 21, Line no. 65, Replace:
"Shu: Khare, Krishnacharya:"
With:
--Shu; Khare, Krishnacharya;--

Under Column no. 22, Line no. 1, Replace:
"Chi-Mon:"
With:
--Chi-Mon;--

Under Column no. 22, Line no. 4, Replace:
"Ned:"
With:
--Ned;--

Under Column no. 22, Line no. 9, Replace:
"Young:"
With:
--Young;--

Under Column no. 22, Line no. 13, Replace:
"Pei-Chun:"

CERTIFICATE OF CORRECTION (continued)
U.S. Pat. No. 12,145,816 B2

With:
--Pei-Chun;--

Under Column no. 22, Line no. 18, Replace:
"Dinesh:"
With:
--Dinesh;--

Under Column no. 23, Line no. 3, Replace:
"Chandra. A. J. Crosby."
With:
--Chandra, A. J. Crosby,--

Under Column no. 23, Line nos. 4-5, Replace:
"Song. H. Jiang. W. M. Choi. D. Y. Khang. Y. Huang. J. A. Rogers."
With:
--Song, H. Jiang, W. M. Choi, D. Y. Khang, Y. Huang, J. A. Rogers,--

Under Column no. 23, Line no. 6, Replace:
"Lamoureux. K. Lee. M. Shlian. S. R. Forrest. M. Shtein."
With:
--Lamoureux, K. Lee, M. Shlian, S. R. Forrest, M. Shtein,--

Under Column no. 23, Line no. 8, Replace:
"Jiang. L. M. Korpas. J. R. Raney."
With:
--Jiang, L. M. Korpas, J. R. Raney,--